United States Patent
Reichenbach et al.

(10) Patent No.: US 7,834,409 B2
(45) Date of Patent: Nov. 16, 2010

(54) MICROMECHANICAL COMPONENT AND CORRESPONDING METHOD FOR ITS MANUFACTURE

(75) Inventors: Frank Reichenbach, Wannweil (DE); Franz Laermer, Weil Der Stadt (DE); Silvia Kronmueller, Schwaikheim (DE); Christoph Schelling, Reutlingen (DE); Tino Fuchs, Tuebingen (DE); Christina Leinenbach, Ensdorf (DE)

(73) Assignee: Robert Bosch GmbH, Stuttgart (DE)

( * ) Notice: Subject to any disclaimer, the term of this patent is extended or adjusted under 35 U.S.C. 154(b) by 365 days.

(21) Appl. No.: 11/883,671

(22) PCT Filed: Jan. 25, 2006

(86) PCT No.: PCT/EP2006/050439

§ 371 (c)(1),
(2), (4) Date: Mar. 11, 2008

(87) PCT Pub. No.: WO2006/082155

PCT Pub. Date: Aug. 10, 2006

(65) Prior Publication Data

US 2009/0026561 A1    Jan. 29, 2009

(30) Foreign Application Priority Data

Feb. 3, 2005    (DE) .................. 10 2005 004 877

(51) Int. Cl.
*H01L 29/82*    (2006.01)
*H01L 21/00*    (2006.01)

(52) U.S. Cl. .......................... 257/419; 438/53
(58) Field of Classification Search ......... 257/414–420, 257/E21.613, E29.324; 438/50–53; 381/174–175

See application file for complete search history.

(56) References Cited

U.S. PATENT DOCUMENTS

| 6,140,689 | A | 10/2000 | Scheiter et al. |
| 6,667,189 | B1 | 12/2003 | Wang et al. |
| 6,790,699 | B2 | 9/2004 | Vossenberg et al. |
| 6,816,301 | B1 | 11/2004 | Schiller |
| 2004/0259286 | A1 | 12/2004 | Dehe et al. |
| 2007/0154040 | A1* | 7/2007 | Chen .................... 381/174 |
| 2009/0166772 | A1* | 7/2009 | Hsieh et al. ............. 257/415 |

FOREIGN PATENT DOCUMENTS

EP    0 969 694    1/2000

OTHER PUBLICATIONS

Scheeper P R et al : "A Review of Silicon Microphones" Sensors and Actuators A, Elsevier Sequoia S.A., Lausanne, CH, vol. A44, No. 1, Jul. 1, 1994, pp. 1-11, XP000469147, ISSN: 0924-4247, figure 9.

* cited by examiner

*Primary Examiner*—Calvin Lee
(74) *Attorney, Agent, or Firm*—Kenyon & Kenyon LLP

(57) ABSTRACT

A micromechanical component having a conductive substrate, an elastically deflectable diaphragm including at least one conductive layer, which is provided over a front side of the substrate, the conductive layer being electrically insulated from the substrate, a hollow space, which is provided between the substrate and the diaphragm and is filled with a medium, and a plurality of perforation openings, which run under the diaphragm through the substrate, the perforation openings providing access to the hollow space from a back surface of the substrate, so that a volume of the medium located in the hollow space may change when the diaphragm is deflected. Also described is a corresponding manufacturing method.

10 Claims, 24 Drawing Sheets

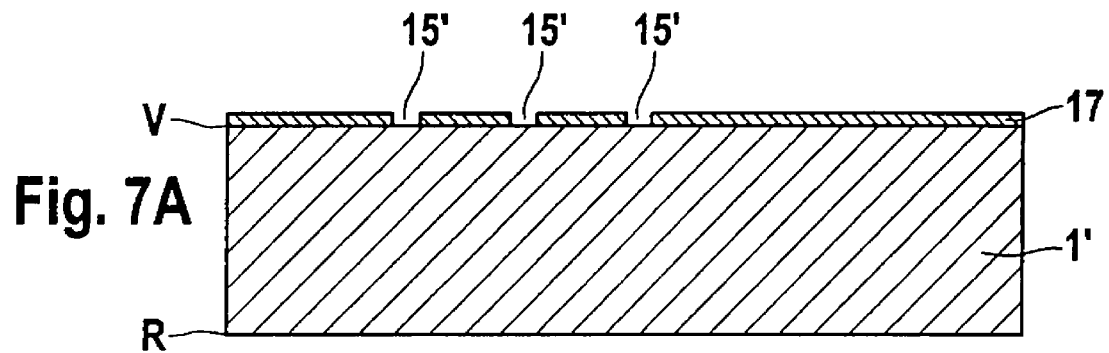
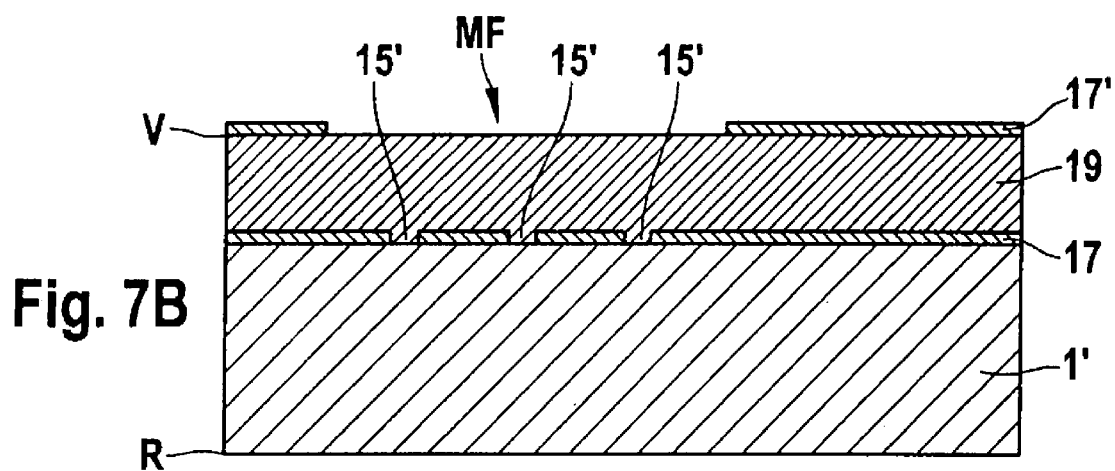

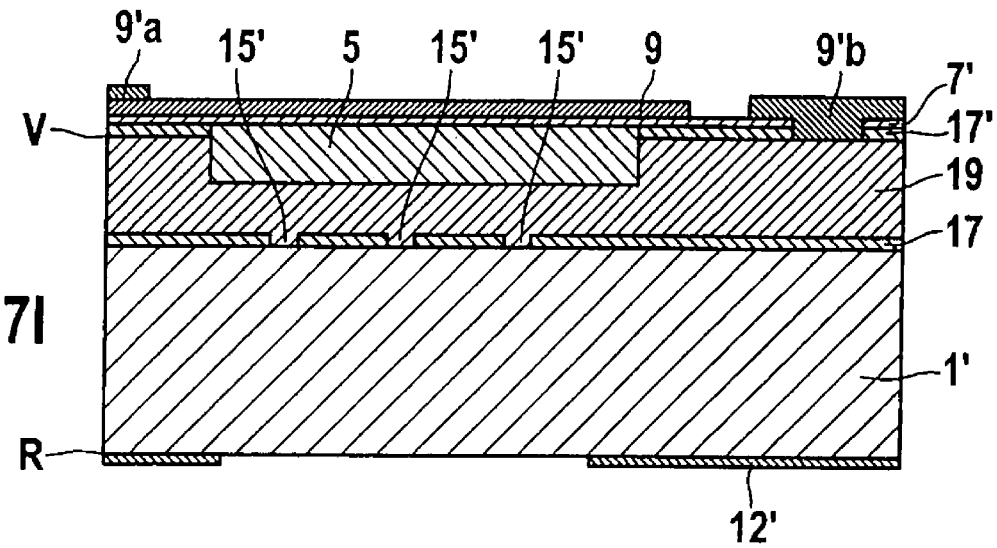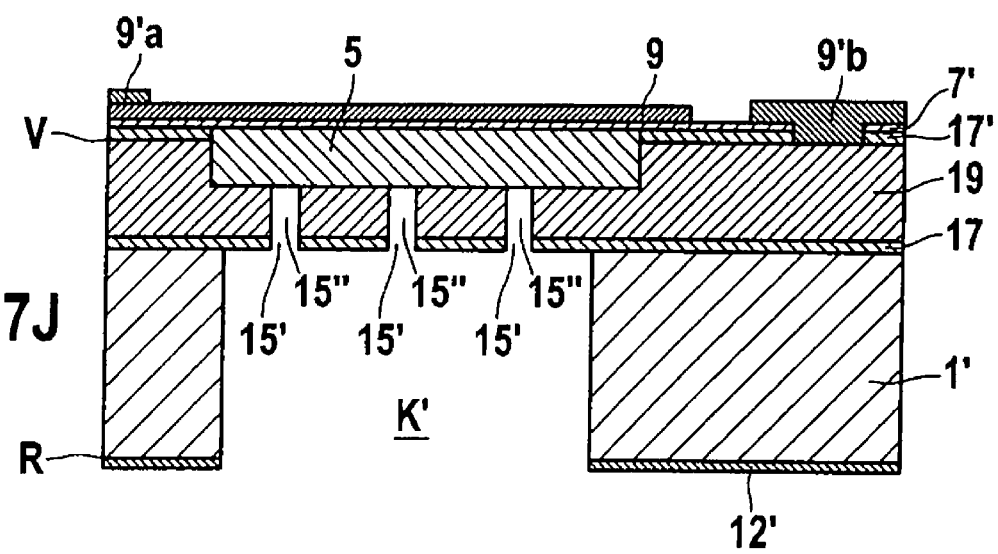

MICROMECHANICAL COMPONENT AND CORRESPONDING METHOD FOR ITS MANUFACTURE

FIELD OF THE INVENTION

The present invention relates to a micromechanical component.

The present invention also relates to a corresponding manufacturing method, which may include capacitive silicon microphones and capacitive pressure sensors.

BACKGROUND INFORMATION

In general, extremely large quantities of microphones (approximately 1.3-1.5 billion pieces/year) are needed in the area of consumer electronics, such as cell phones, hi-fi devices, or the like, and increasingly in the automotive industry as well, e.g. for voice input. In addition to the hitherto favored design approaches on an electret basis or in the form of precision designs including piezoelectric, capacitive, or inductive signal conversion, solid-state, silicon-based microphones are increasingly entering the market.

The hitherto available manufacturing processes for such solid-state microphones are, however, quite costly. The general design of a solid-state microphone provides for a perforation from the back surface of the wafer under a self-supporting diaphragm of the front side of the wafer, this perforation for one thing making available gas damping mechanisms. Secondly, the perforation, e.g. in the case of face-down assembly on a board or a hybrid by flip-chip connection techniques, also allows sound to pass through in the case of acoustic irradiation from the back surface of the wafer.

In addition, the openings provide pressure compensation, in order to prevent predeflection of the diaphragm when there are changes in the ambient atmospheric pressure. If the diagram is deflected by sound, then under the diaphragm, the gas at approximately atmospheric pressure, present there between the lower side of the diaphragm and the upper side of the counterplate, is compressed, which results in a stream of gas through the pores of the counterplate. This gas stream removes energy from the vibratory system and, with appropriate dimensioning, ensures gas damping of the diaphragm movement and a uniform shape of the spectral characteristic of the microphone. Independently of the function as sound transducer, such a component also always represents a relative pressure sensor, that is, pressure differences between diaphragm front side and diaphragm back surface lead to a corresponding diaphragm deflection, in which, in the case of a pressure sensor, the gas fluidics in the gap under the diaphragm plays only a subordinate part, as a rule. Therefore, a microphone of the described construction type is a relative-pressure sensor expanded by functional gas fluidics and additional volumes and compensating openings, which ultimately make the pressure-sensor component into a sound transducer.

In a capacitive microphone, the counterplate under the diaphragm or the bulk wafer is used as an electric counterelectrode to the diaphragm, i.e. changes in the capacitance across the air-gap capacitor made up of the diaphragm and the counterelectrode are detected in a suitable manner and converted into an electrical signal, which represents the diaphragm deflection and, therefore, the detected sound level.

The micromechanical component of the present invention having the features described herein and the manufacturing method described herein have the advantage, that they propose a simple and reliable process for manufacturing micromechanical components, in particular capacitive silicon microphones, which may be implemented in a particularly cost-effective manner.

Independent of the specific design of such a component with regard to the dimensioning of the diaphragm, the thickness of the counterplate, the diameter and the number of perforation openings, or the electrical signal conversion principle specifically used, some basic method steps are necessary:

perforating the back surface of the wafer for gas exchange under the diaphragm or for back surface acoustic irradiation of the diaphragm, or as pressure-compensation openings, i.e. introducing openings on the back surface of the wafer with the aid of etching, mainly anisotropic etching;

positioning and electrically contacting a suitable evaluating arrangement on the diaphragm, or the diaphragm itself in the case of capacitive detection;

installing and electrically contacting a counterelectrode in the case of capacitive detection;

producing a self-supporting diaphragm on the front side of the wafer, i.e. applying the diaphragm and using suitable sacrificial-layer technology, which may be isotopic sacrificial-layer technology, for exposing or undercutting the diaphragm; and if applicable, dicing up by way of sawing and packaging.

According to the exemplary embodiments and/or exemplary methods of the present invention, process steps difficult to control are avoided to the greatest possible extent, as well as exotic process steps, such as pasting wafers onto substrate wafers, or the like. The core part of the process is the trench etching of the back surface of the wafer in conjunction with subsequent sacrificial-layer etching under the future diaphragm, the sacrificial-layer etching having an extremely high selectivity with respect to the silicon base material and silicon-based dielectric layers. Without further measures to protect the surrounding silicon, this very high selectivity allows the sacrificial-layer etching technique to be implemented without attacking the existing silicon structures or functional dielectric layers, which markedly simplifies the entire process again.

The process sequence of the exemplary embodiments and/or exemplary methods of the present invention is IC-process-compatible without limitation, which means that an electrical evaluation circuit for signal conversion and signal processing may also be integrated on the front side of the wafer, where it appears useful for the intended application.

This is so, because all of the micropatterning processes used, with the exception of HF-vapor etching, are in general completely compatible with integrated circuits likewise present on the wafer. Since the optional HF-vapor etching takes place from the back surface of the wafer, it does not reach the sensitive patterns of the front side of the wafer, when the process technology provides for a wafer back surface/wafer front side media separation, e.g. using, during the HF-vapor etching, a suitable wafer fixture having O-ring seals from the front side of the wafer and/or the back surface of the wafer. Technical design approaches which can ensure these media separations are well-known, i.e. familiar to one skilled in the art of HF-vapor etching technology and skilled with the corresponding etching apparatuses.

Advantageous embodiments of the specific subject matter of the present invention, as well as improvements thereto, are set forth in the dependent claims.

The diaphragm is provided to be either convex or flat over the front side of the substrate. Under certain circumstances, the corresponding angle formed by the diaphragm can generate a change in the state of stress of the diaphragm, whereby in certain applications, for instance, diaphragm's predeflection can become too great.

A convexity or diaphragm predeflection occurs if the sacrificial layer is mounted onto an unpatterned substrate and is then patterned. A convexity in the diaphragm or a diaphragm predeflection can be avoided by providing a region into which the sacrificial layer can be sunk, so that in the further process no further stage is developed in the diaphragm layer lying above it, and this is done, for instance, by using anisotropic etching technology in the substrate, or in an electrode layer provided on a substrate, which is used as lower electrode. This removes the problem of the corresponding angle in the attachment of the diaphragm; and the subsequent deposition of the diaphragm layers takes place in a plane, without topography development. For the implementation it should be avoided that the recess in the lower electrode expresses itself in a distinct topography over the entire wafer after the deposition of the sacrificial layer which may be made of $Si_{1-x}Ge_x$. In that case, a planarization using a CMP step after the sacrificial layer deposition would be indispensable. One is able to avoid this by a selective growing process of silison-germanium or germanium on silicon, but not on $SiO_2$, on which no growth of these germanium-containing materials should take place. A selective deposition of the sacrificial layer has the advantage that only the provided recess in the substrate and in the counterelectrode is coated and the surrounding, dielectrically covered areas do not experience any layer growth. For this purpose, the polysilicon areas outside the recess are covered with a dielectric layer, for instance, an oxide layer. Advantageously, in the process flow for manufacturing a microphone or pressure sensor, an oxide layer for electrical insulation is provided anyhow. The region not covered with oxide that is immerged in the polysilicon counterelectrode or in the substrate is covered with silicon-germanium or with pure germanium, for better epitaxial growth conditions (with silicon as the starting medium). In response to suitable process control (deposition temperature, pressure) the selectivity of this selective growth process can even be promoted. The disadvantage of the corresponding angle in the diaphragm attachment as well as cost-intensive aftertreatment steps, such as CMP (chemical mechanical polishing) in the countersinking of the sacrificial layer without selective growth are therewith overcome, according to this aspect.

According to one exemplary refinement, the perforation openings lead into a cavity, which is provided in the back surface of the substrate, under the diaphragm.

A further exemplary refinement provides for the diaphragm to be made out of a single conductive layer.

According to a further exemplary refinement, the diaphragm is made out of an upper conductive layer and a lower, first dielectric layer.

A further exemplary refinement provides for the substrate to have a wafer substrate, a second dielectric layer situated on it, and a silicon-material layer on the second dielectric layer, perforation openings running through the second dielectric layer, and the second dielectric layer electrically insulating the wafer substrate and the substrate-material layer on it from each other outside of the perforation openings.

According to a further exemplary refinement, a third dielectric layer is provided on the front side of the substrate, between the substrate and the diaphragm, the third dielectric layer preferably taking the form of a very thin layer (<500 nm, especially <100 nm) and being intended to function as a diffusion barrier against thermal outdiffusion of sacrificial-layer material, in particular germanium.

A further exemplary refinement provides for the damping medium to be a gas.

BRIEF DESCRIPTION OF THE DRAWINGS

FIGS. 7A-L shows schematic cross-sectional views of the essential manufacturing steps of a micromechanical component in the form of a capacitive microphone or pressure sensor, according to a seventh specific embodiment of the present invention.

DETAILED DESCRIPTION

Figure 1A:
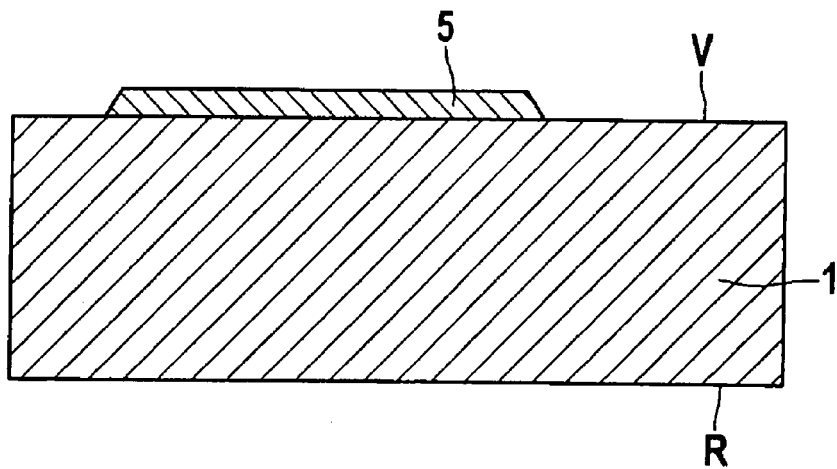
FIGS. 1A-G shows schematic cross-sectional views of the essential manufacturing steps of a micromechanical component in the form of a capacitive microphone, according to a first specific embodiment of the present invention.

In the figures, like reference numerals designate like or functionally equivalent components.

FIGS. 1A-G show schematic cross-sectional views of the essential manufacturing steps of a micromechanical component in the form of a capacitive microphone or pressure sensor, according to a first specific embodiment of the present invention.

In FIG. 1a, reference numeral 1 denotes a silicon wafer substrate. In a first process step, a sacrificial layer 5 of SiGe or Ge, preferably $Si_{1-x}Ge_x$, is deposited on silicon-wafer substrate 1 on front side V of the wafer, where x is preferably 0.1-0.8 and especially 0.2-0.5. Sacrificial layer 5 is subsequently patterned to form an island in the future diaphragm region, or to form a plurality of islands in a plurality of diaphragm regions, in accordance with a plurality of components. The layer thickness of sacrificial layer 5 may amount to a few μm and determines the future air gap between the future diaphragm and the counterplate, which form the capacitor for the capacitive evaluation of the microphone.

Figure 1B:
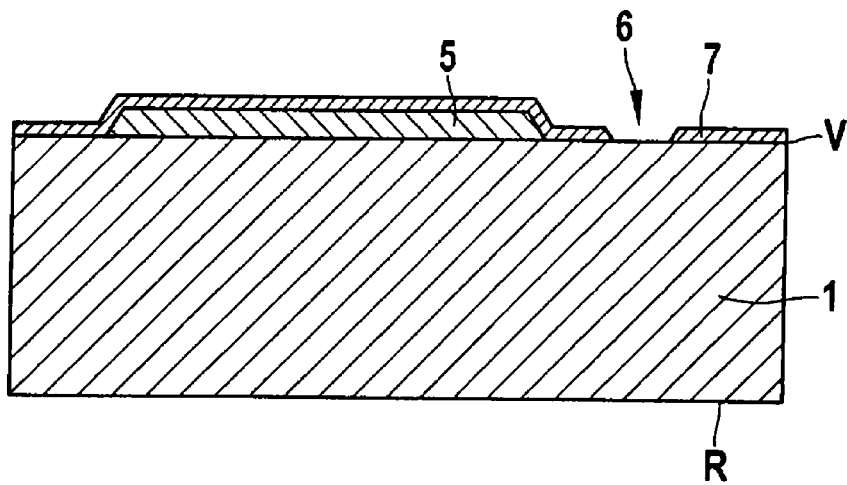

According to FIG. 1B, a dielectric layer 7 is then deposited on front side V of the wafer and over island-shaped sacrificial layer 5, or grown on by thermal oxidation, and patterned in such a manner, that at least the specific island-shaped region of sacrificial layer 5 is completely covered. A window 6, through which silicon-wafer substrate 1 may subsequently be electrically contacted by suitable metallic layers, is then opened in dielectric layer 7.

It is possible and advantageous to allow dielectric layer 7 to remain everywhere outside of windows 6, since it represents electrical insulation and passivation, on which, e.g. metallic conductor tracks and contacting areas may be subsequently produced, which must be insulated from subjacent silicon-wafer substrate 1. This dielectric layer 7 is particularly suited as insulation for a contacting area and an electrical connection of the diaphragm region via suitable conductor tracks, which must be guided so as to be insulated from silicon-wafer substrate 1.

Silicon oxide subjected to tensile stress, a silicon oxynitride, or also a silicon nitride is preferably suited as material for dielectric layer 7. Layer 7 should have a tensile stress, since it should later form a part of the microphone diaphragm as well, and this should, if possible, not be subjected to compressive stress to prevent the diaphragm from buckling or kinking outwards. While accepting the last-named disadvantages, one may, however, still use a (pressure-stressed) thermally grown on silicon oxide ($SiO_2$), which offers advantages with regard to an especially high quality electrical insulation by the thermal oxide.

Figure 1C:
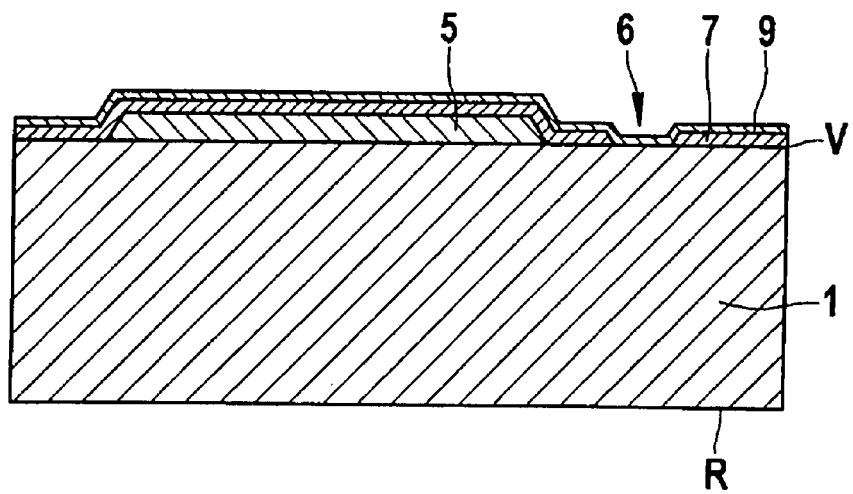

As shown in FIG. 1C, an electrically conductive layer 9 is then deposited over the entire structure and patterned to cover the region of the future diaphragms and the future electrical contacts in windows 6. This electrically conductive layer 9 may be formed by a metal, such as Al, AlSi, AlCu, AlSiCu, W, WTi, WTi/Au, Cr/Au, Pt, Ni, Ni/Au, etc., or alternatively by a metal silicide, such as WSi, AlSi, PtSi, etc., or alternatively a layer sequence of a lower polysilicon layer or polysilicon-germanium layer having a metallic layer over it, such as Al, W, WTi, Au, Pt, . . . . It is also possible to deposit a layer of polysilicon or polysilicon-germanium as an electrically conductive layer 9 and pattern it so that only the region of the future diaphragm is covered, and additionally to deposit a metallic layer and pattern it so that the metal only remains in contact regions of windows 6 and in the form of so-called conductor tracks. In the latter case, one would therefore have a future diaphragm, which is only still made of dielectric layer 7 and an electrically conductive layer 9 of polysilicon or polysilicon-germanium, in some instances, dielectric layer 7 also being able to be subsequently removed optionally under the region of conductive layer 9 forming the diaphragm, and the metal only remaining in the region of the conductor tracks and the contacting areas.

It is particularly simple and therefore advantageous to provide a metallic conductive layer 9, which forms both the upper side of the diaphragm and the region of the conductor tracks and contacts, since this layer 9 may only be deposited and patterned in a single process step, which is also particularly cost-effective. In the latter case, the future diaphragm made up of dielectric layer 7 and superjacent, electrically conductive layer 9 is made of metal, as mentioned, dielectric layer 7 also being optionally removable, in the end, under metallic, electrically conductive layer 9, if the respective metal has sufficiently good mechanical properties by itself. Since many metallic layers used in semiconductor technology (e.g. aluminum or aluminum alloys) have hysteresis effects intrinsic to the material, such components are only suitable for low-level signal applications, i.e. work situations in which mechanical deflections are small. A use as a pressure sensor is therefore eliminated; the component can then only be used as a microphone or sound transducer.

In addition, it is possible to deposit a passivation layer (not shown) over the layer sequence of dielectric layer 7 and conductive layer 9, and to pattern it so that it only leaves windows 6 open for contacting electrically conductive layer 9. Deposited layers of SiN, $Si_3N_4$ over SiC are suitable as a passivation layer. As in the case of oxidic silicon layers, these layers may be locally removed by plasma etching methods in the region of the future metallic contacts, in order to allow subsequent wire bonding or a flip-chip technique for connection to the metallic contacts. If a non-corroding material system, such as Au, Pt, Ag or WTi/Au, Cr/Au, Cr/Ni/Au, etc., is used as a metal, the passivation may also be omitted without being detrimental to the rigidity of the microphone during subsequent use. If Al or an Al-alloy is used as a metallic layer, the "face-down" flip-chip assembly technique is recommended for protecting the front side of the chip from corrosive surrounding media with the aid of polymeric underfiller.

Figure 1D:
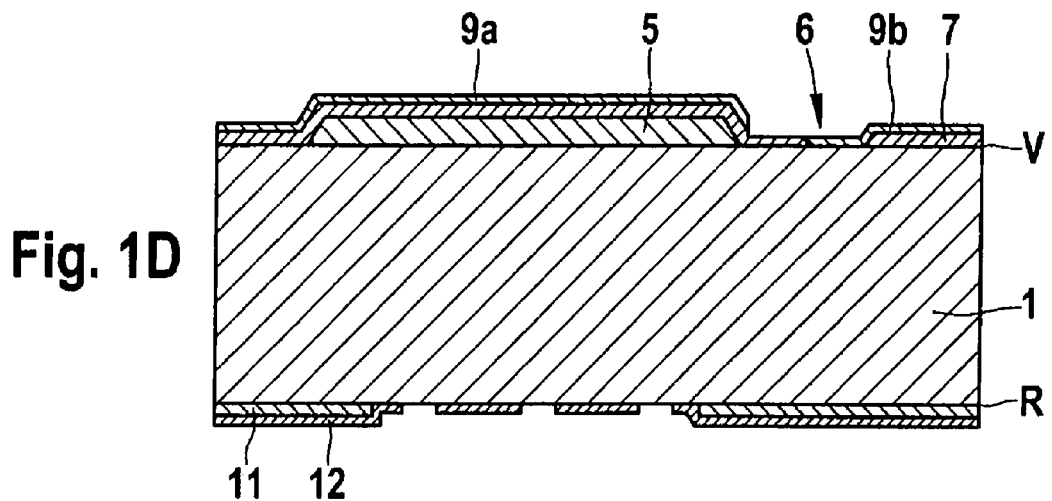

In the next process step illustrated in FIG. 1D, conductive layer 9 is patterned to form a region 9a for electrically connecting or forming the future diaphragm and a region 9b for electrically connecting wafer substrate 1. To prepare a two-stage trench etching process on back surface R of the wafer, a first dielectric masking layer 11 is then initially applied as a so-called hard-material layer of silicon oxide or silicon oxynitride and photolithographically patterned in such a manner, that future cavities K are consequently defined under the microphone diaphragms. An additional masking layer 12 of thickened photoresist is applied over first masking layer 11 and patterned in such a manner, that future perforation holes 15 are consequently defined.

FIG. 1D shows the process state including the two masking layers 11, 12 deposited on the back surface, silicon-wafer substrate 1 being exposed in the region of future perforation holes 15.

Figure 1E:
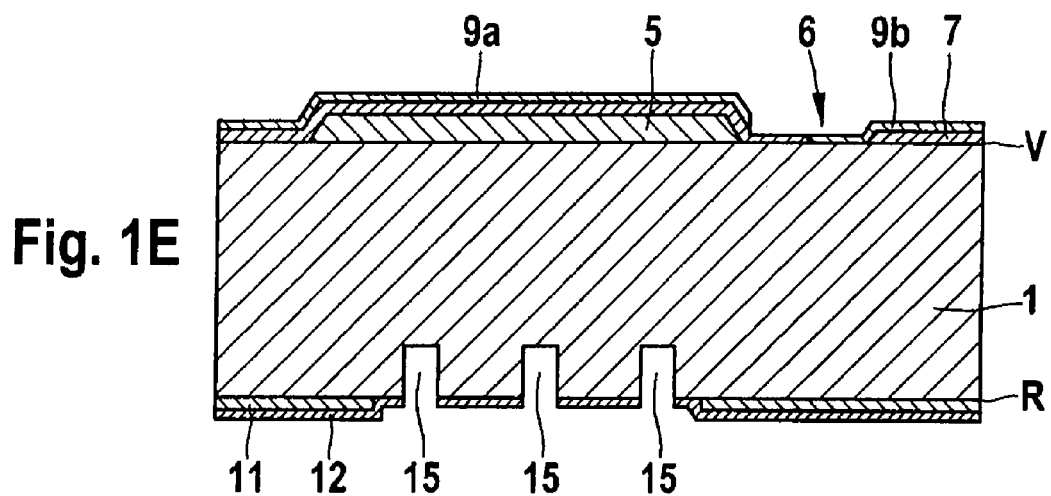

According to FIG. 1E, e.g. using a method as is known from DE 42 41 045 C2, one then begins to etch in perforation holes 15 into silicon-wafer substrate 1 from back surface R of the wafer, to a particular depth, with the aid of thick masking layer 12 of photoresist.

Figure 1F:
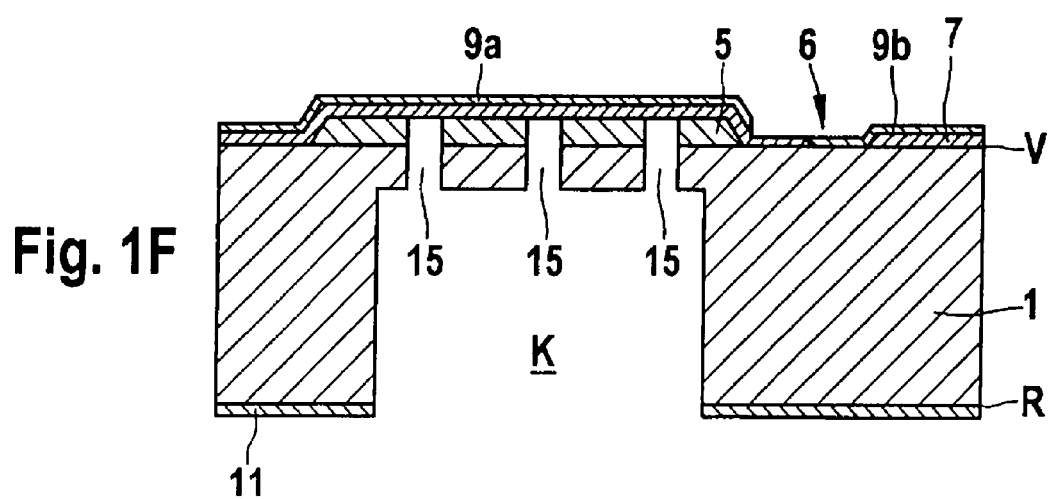

Therefore, perforation holes 15 receive a certain head start over a second etching front, which is formed when, after the removal of photoresist masking layer 12, etching is now continued with the aid of consequently exposed masking layer 11 of hard material. Thus, a wide etching front runs into the depression, which defines the geometry of cavities K under the future microphone diaphragms, those etching fronts, which define perforation holes 15, running on ahead of this "main etching front." This etching procedure is carried out until perforation holes 15 are driven through sacrificial layer 5 to dielectric layer 7 on front side V of the wafer and finally stop on it or experience an approximate etching stop on it. This state is shown in FIG. 1F.

In order now to expose diaphragms M, etching is carried out from back surface R of the wafer, using the process gas chlorine trifluoride $ClF_3$ or another gas, such as $ClF_5$, $BrF_3$, $BrF_5$, $XeF_2$, or $IF_5$ or $IF_7$, the pressure being, e.g. 5 Pa to 1000 Pa, preferably 10 Pa to 100 Pa, and the wafer temperature being −30° C. to +40° C., preferably −20° C. Under these conditions, sacrificial layer 5 under diaphragm M is etched through perforation holes 15 from back surface R of the wafer, selectively with respect to silicon and dielectric, silicon-based layers, such as silicon oxide or silicon oxynitride, without the need for further measures for their passivation.

Under the specified process conditions regarding layer composition and etching parameters, selectivity of the etching of SiGe compared to Si is typically 4000:1 to 10000:1, which means that sacrificial layer 5 under diaphragm M may be completely removed through perforation holes 15 without noticeably etching the functional silicon structural members or the functional dielectrics.

Figure 1G:
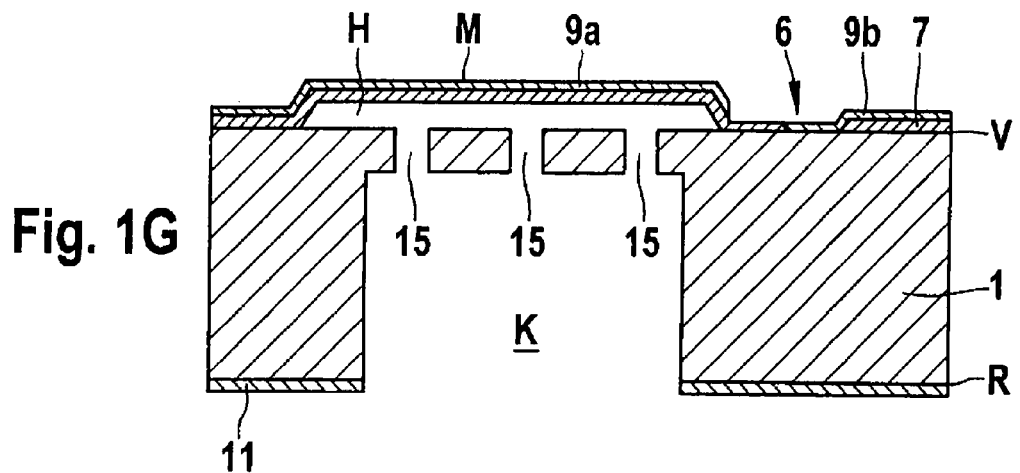

FIG. 1G shows the result after completion of the sacrificial-layer etching, finished processed wafer 1 having self-supporting, completely undercut microphone diaphragms M, and subjacent hollow spaces H between substrate 1 and diaphragm M.

After completion of the sacrificial-layer etching, finished processed wafer 1 may be placed on a protective foil, a so-called sawing foil, with its wafer back surface R, and subsequently diced up by sawing it into individual chips. In this context, the protective foil on back surface R of the wafer prevents water or saw sludge from penetrating into the backside cavities and into the gap between diaphragm M and the perforated counterplate from silicon-wafer substrate 1, which could subsequently impair the function of the microphone. After the sawing, cleaning, and drying, the substrate foil may be expanded, and the individual chips may be picked off from the now cleaned and dried foil and mounted, for example, in individual housings or on a printed circuit board.

When the terminal pads of the front side of the wafer are appropriately pretreated with an underbump metallic coating and the application of soldering bumps, etc., it is possible to mount these individual chips face-down on a printed circuit board or on a hybrid, using flip-chip technology. This assembly technique protects the sensitive diaphragm and the front side of the wafer, in particular the metal of the front side of the wafer, from environmental effects. In this case, the acoustic irradiation occurs from the back surface all the way through perforation holes 15.

FIGS. 2A-H show schematic cross-sectional views of the essential manufacturing steps of a micromechanical component in the form of a capacitive microphone or pressure sensor, according to a second specific embodiment of the present invention.

In the second specific embodiment of the present invention, critical dimensions of the lower counterplate under the microphone diaphragm, in particular its thickness and the diameter of the perforation openings, are not defined via differential etching from the back surface of the wafer, as in the first specific embodiment, but by a wafer front-side process, which allows these dimensions to be adjusted more accurately.

Figure 2A:
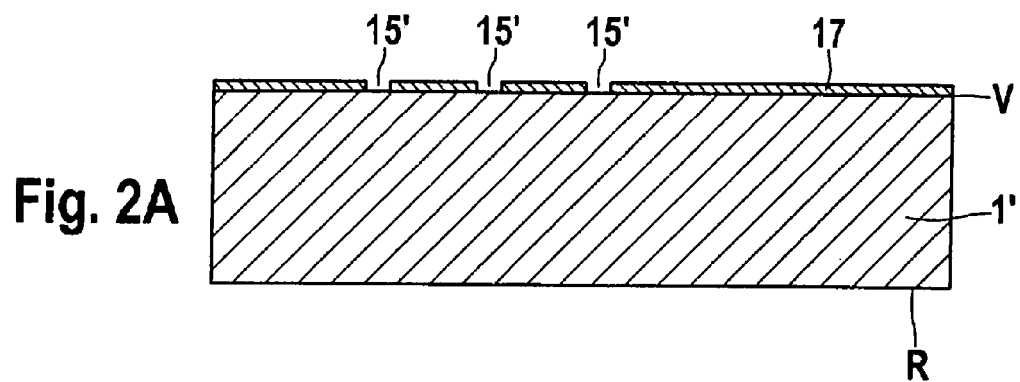
FIGS. 2A-H shows schematic cross-sectional views of the essential manufacturing steps of a micromechanical component in the form of a capacitive microphone, according to a second specific embodiment of the present invention.

According to FIG. 2A, on a silicon-wafer substrate 1', a dielectric layer 17 of, for example, silicon oxide is deposited or chemically oxidized onto front side V of the wafer. Mask openings 15' corresponding to future perforation holes in the future counterplate are lithographically defined and opened in this dielectric layer 17 as windows.

Figure 2B:
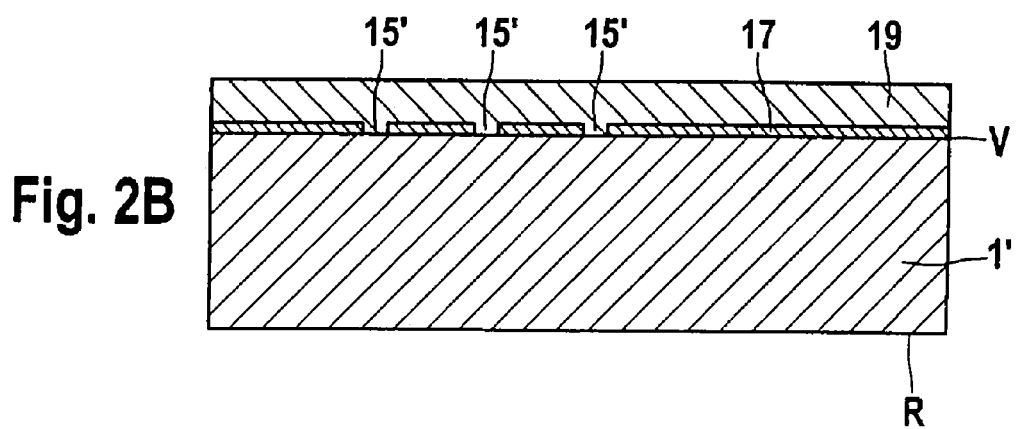

In the next step illustrated in FIG. 2B, a polysilicon layer 19 is deposited on the entire surface of front side V of the wafer. In particular, after an unshown polysilicon starting layer is deposited in a LPCVD-Reaktor, this layer is reinforced (thickened) in an epitaxial reactor at a high deposition rate, to the desired thickness of, e.g. 10 to 30 µm. The rough surface of epitaxial polysilicon layer 19 may be subsequently leveled by grinding and polishing, and epitaxial polysilicon layer 19 may then be doped and consequently rendered sufficiently electrically conductive.

Figure 2C:
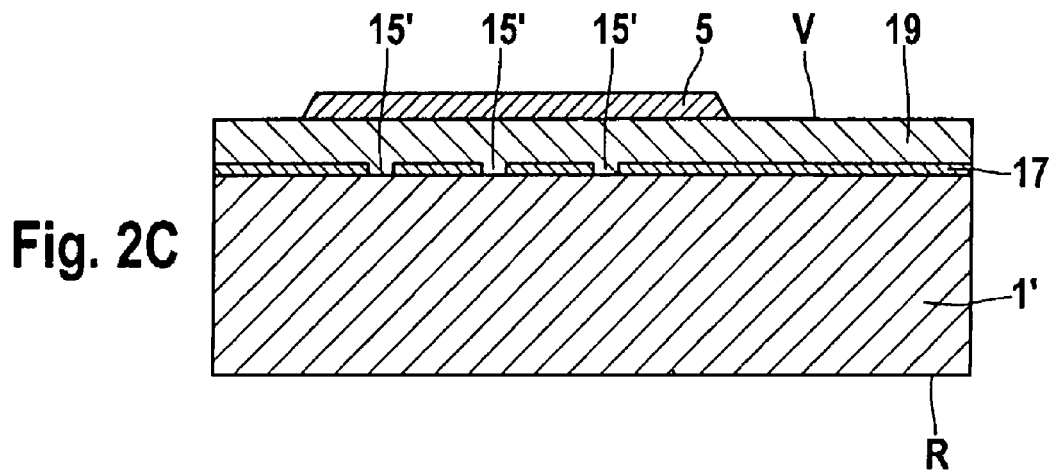

With reference to FIG. 2C, sacrificial SiGe layer 5 already known from the above-mentioned, first specific embodiment is then deposited on front side V of the wafer and patterned to form islands in the region of the future diaphragms, using photolithography and etching.

Figure 2D:
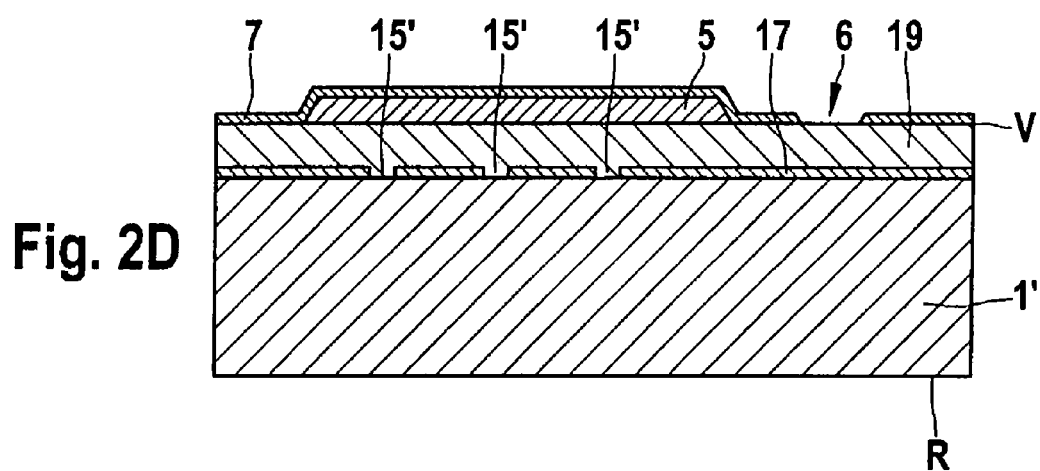

In the following process step illustrated in FIG. 2D, dielectric layer 7 is deposited on the entire surface and a window 6 is lithographically patterned in it in a manner analogous to FIG. 1B.

Figure 2E:
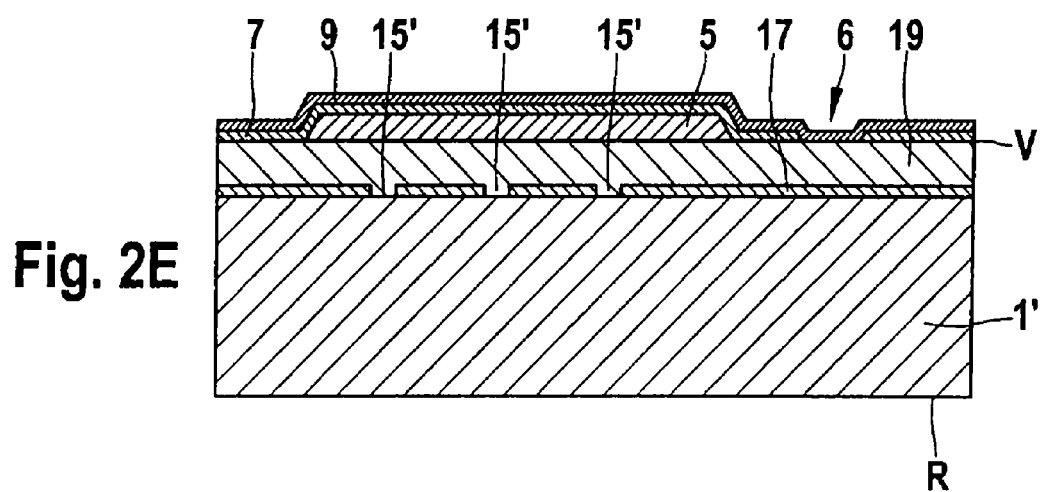

According to FIG. 2E, electrically conductive layer 9 is then deposited over the entire surface of the pattern in a manner analogous to FIG. 1C.

The possible materials and variants for layers 7, 9 are exactly the same in the second specific embodiment as in the above-mentioned, first exemplary embodiment.

Figure 2F:
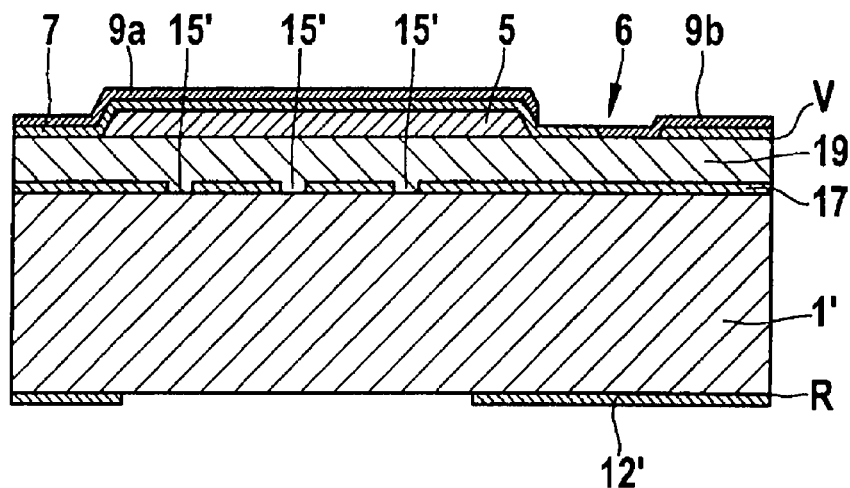

In the next process step illustrated in FIG. 2F, conductive layer 9 is patterned in region 9a for electrically connecting or forming the future diaphragm, and patterned in region 9b for electrically connecting wafer substrate 1. Continuing, in reference to FIG. 2F, a masking layer 12', which is preferably a thick resist mask, is then deposited on back surface R of the wafer; for its part, the thick resist mask being photolithographically patterned to define cavity K' under the future diaphragm. As an alternative, a hard-material layer in the form of, e.g. silicon oxide may also be used, which is prepatterned via a photoresist mask and is subsequently used as the actual trench mask.

In contrast to the above-mentioned, first specific embodiment, only single-layer, back-side masking by masking layer 12' is needed in the second specific embodiment, since mask openings 15' predetermined in dielectric layer 17 only render a one-stage, deep-etching process necessary for producing both cavity K' and perforation holes 15".

Figure 2G:
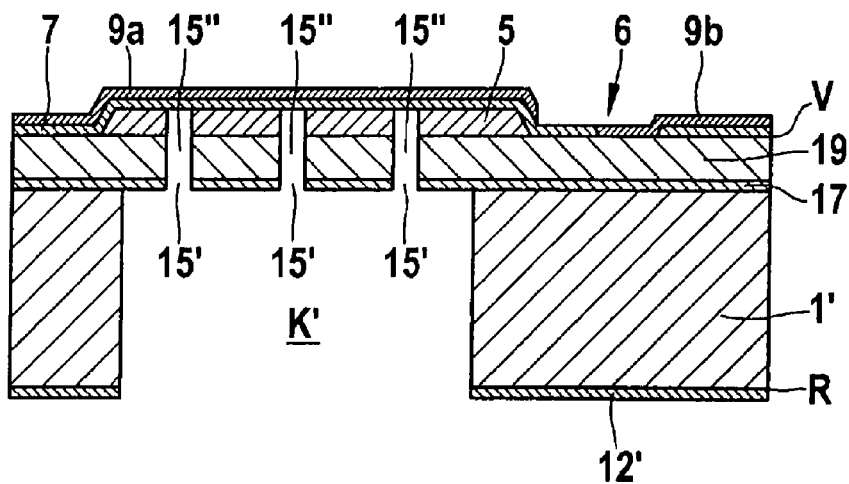

With reference to FIG. 2G, this single-stage, deep-etching process is then carried out for the purpose of trenching, cavities K' being driven (produced) two-dimensionally from back surface R of the wafer to front side V of the wafer. As mentioned, the deep-etching process may be a plasma etching process as described, for example, in DE 4241045 C2. The deep-etching process stops two-dimensionally on patterned dielectric layer 17 between silicon-wafer substrate 1' and epitaxial polysilicon layer 19, except for in mask openings 15', where the deep-etching process subsequently continues to progress in epitaxial polysilicon layer 19 towards front side V of the wafer and perforation openings 15" are formed adjacent to mask openings 15'.

The etching process stops after polysilicon layer 19 and sacrificial layer 5 are etched through to dielectric layer 7, which is made of silicon oxide, silicon oxynitride, or silicon nitride and forms a part of future diaphragm M, as can be seen in FIG. 2G.

Figure 2H:
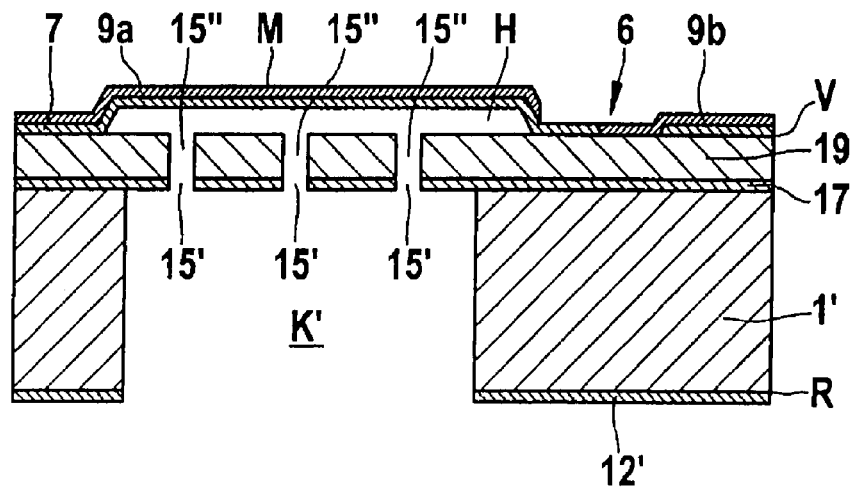

In the following step shown in FIG. 2H, sacrificial layer 5 is then removed in a highly selective manner, using, once again, the above-described, isotropic etching from back surface R of the wafer, in order to expose diaphragm M and form hollow space H.

As in the case of the first specific embodiment, dielectric layer 7 may also optionally be removed, if necessary, from back surface R of the wafer in the region of diaphragm M, e.g. using HF-vapor etching, if electrically conductive layer 9 is suitable as the only diaphragm. However, in most cases, it is advantageous and simpler to retain dielectric layer 7 and leave it as a component of diaphragm M. This also allows a system on diaphragm M, which system is metallic in all cases, to be protected from an aggressive environment from its lower side. This is then particularly advantageous and effective, when the silicon microphone designed in this manner is subsequently mounted face-down on a printed circuit board or a hybrid, e.g. using flip-chip technology, and acoustically irradiated from its back surface.

In addition, the sectioning and assembly are accomplished as already described in the above-mentioned, first specific embodiment.

FIGS. 3A-H show schematic cross-sectional views of the essential manufacturing steps of a micromechanical component in the form of a capacitive microphone or pressure sensor, according to a third specific embodiment of the present invention.

For purposes of understanding the third specific embodiment explained in the following, it is emphasized that a microphone is not a measuring device in the strict sense of the term, but rather a sound transducer, whose behavior is determined by the diaphragm characteristics, by the gas spring under the diaphragm, and by the gas damping. In this context, measurement errors in the percent range, i.e. hystereses based on the type of selected diaphragm material, for example (on the basis of using metals such as aluminum or Al-alloys as a component of the pressure-sensitive diaphragm), only play a subordinate role since, in particular, a microphone is usually operated in the case of low-level signals, i.e. in the case of small mechanical deflections where hystereses do not produce a significant interference effect. However, the situation is different with a pressure sensor. It is a measuring instrument, and the required measuring accuracy is normally high. Pressure sensors are also not restricted to the case of a low-level signal during their use, but must accurately convert larger diaphragm deflections into an electrical signal. In this context, hystereses are normally unacceptable. For this reason, only hysteresis-free materials, such as polysilicon, may be used as components of the pressure-sensitive diaphragm in a pressure sensor, while many metals, such as aluminum pads and aluminum conductor tracks, may be used outside of the diaphragms, preferably spatially far removed from the diaphragm. Of course, in the case of a microphone, one may also refrain from using such metals and proceed in the sense of the following description, e.g. in order to produce a particularly good microphone.

These requirements are taken into account by the present, third specific embodiment, which describes the production of a relative-pressure sensor or a particularly high-quality microphone, derived from the above-mentioned microphone process.

It preferably uses a combination of a dielectric layer 7 of silicon oxide and a conductive layer 9 of polysilicon as a diaphragm material. Dielectric layer 7 may be removed in one variant, so that only conductive layer 9 of polysilicon remains as the diaphragm material.

In its essential features, the process sequence corresponds to that of the above-described, first specific embodiment. In particular, as can be seen from FIGS. 3A-C, sacrificial layer 5 is initially formed in the island-like diaphragm region, and dielectric layer 7 of silicon oxide is subsequently deposited, and conductive layer 9 of polysilicon is then deposited.

In a subsequent process step illustrated in FIG. 3D, conductive layer 9 of polysilicon is initially patterned, and exposed dielectric layer 7 is subsequently patterned, in order to form window 6 in the latter, the window providing access to silicon-wafer substrate 1.

Figure 3A:
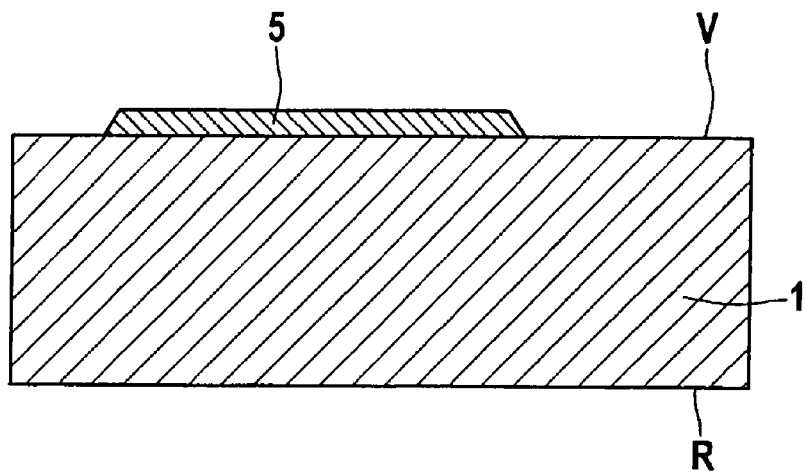
FIGS. 3A-H shows schematic cross-sectional views of the essential manufacturing steps of a micromechanical component in the form of a capacitive microphone or pressure sensor, according to a third specific embodiment of the present invention.
Figure 3B:
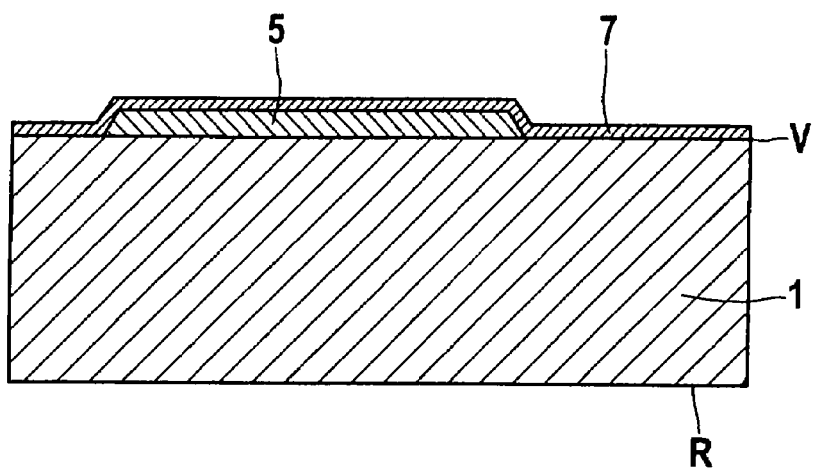
Figure 3C:
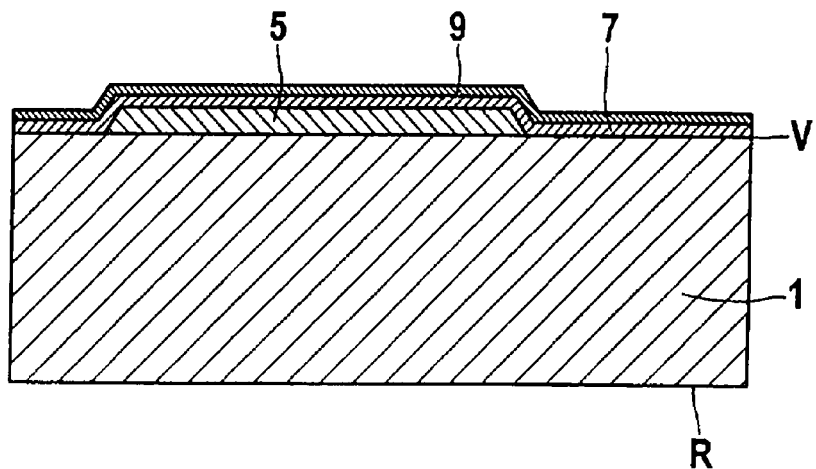
Figure 3D:
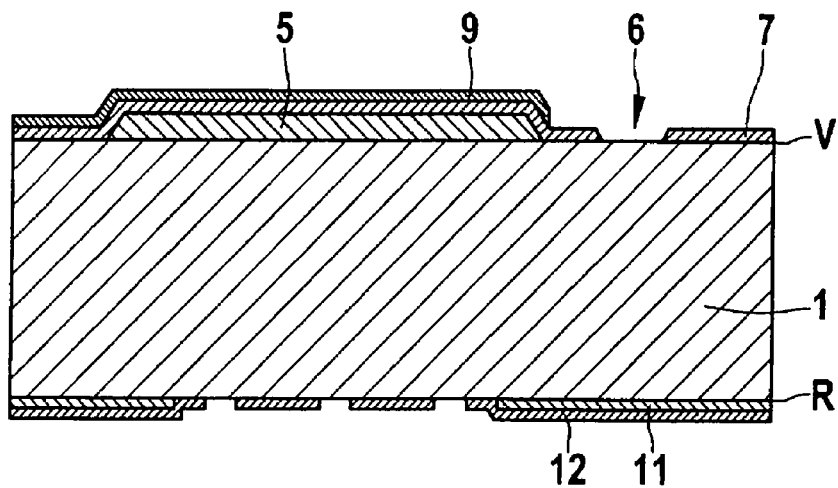
Figure 3E:
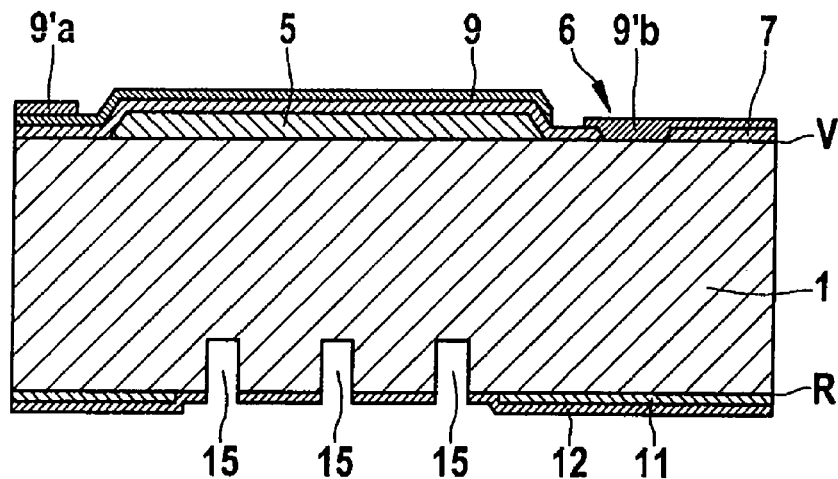
Figure 3F:
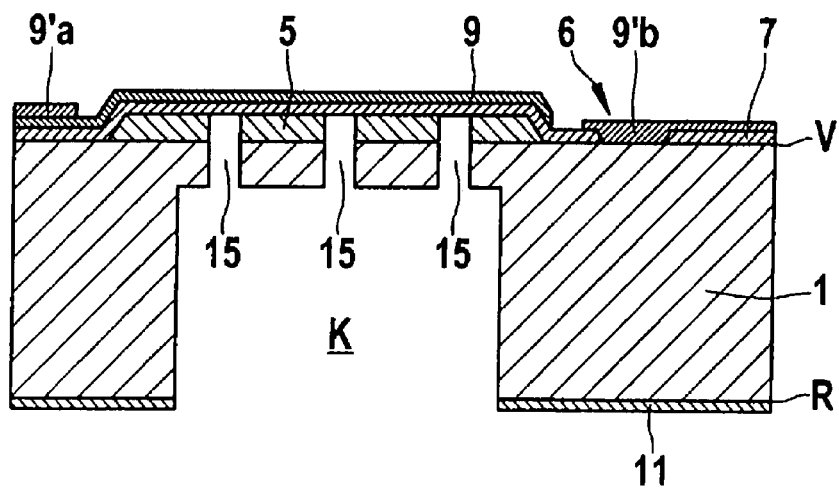
Figure 3G:
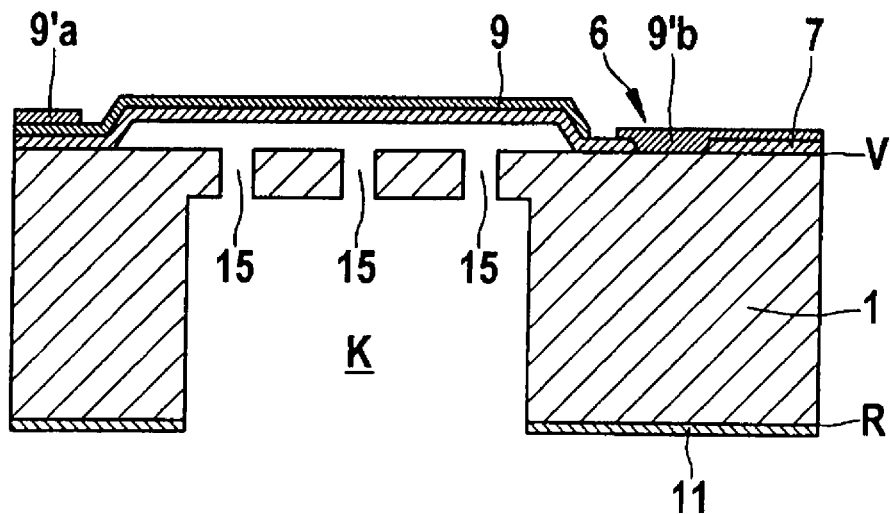

Only when it comes to a process step illustrated in FIG. 3E, is an additional conductive layer deposited, which contacts conductive layer 9 in region 9'a outside of the diaphragm region and contacts silicon-wafer substrate 1 through window 6 in region 9'b. In other words, the additional conductive layer is completely removed from the diaphragm region and patterned in such a manner, that it only remains in the contact region as region 9'b and in the bonding area of the sensor element as region 9'a.

The process steps according to FIG. 3E on the back surface of the wafer, as well as those according to 3F and 3G, correspond to the process steps according to FIGS. 1E, 1F, and 1G.

Figure 3H:
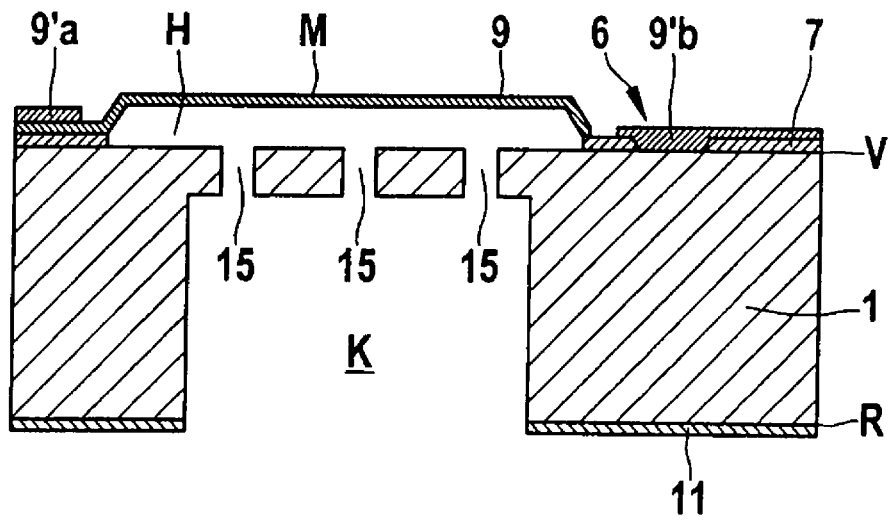

Finally, in accordance with FIG. 3H, dielectric layer 7 is removed in the diaphragm region in an HF-etching step, so that conductive layer 9 alone forms diaphragm M having the hollow space under it.

FIGS. 4A-I show schematic cross-sectional views of the essential manufacturing steps of a micromechanical component in the form of a microphone or pressure sensor, according to a fourth specific embodiment of the present invention.

The modification of the second specific embodiment to form the fourth specific embodiment is analogous to the modification of the first specific embodiment to form the third specific embodiment.

Figure 4A:
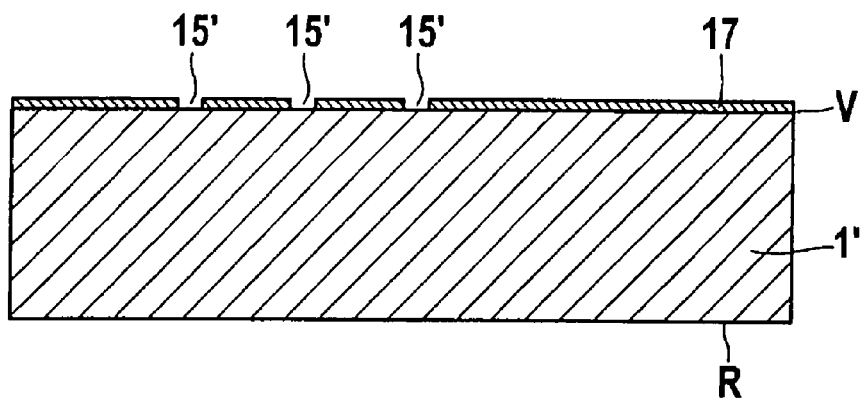
FIGS. 4A-I shows schematic cross-sectional views of the essential manufacturing steps of a micromechanical component in the form of a capacitive microphone or pressure sensor, according to a fourth specific embodiment of the present invention.
Figure 4B:
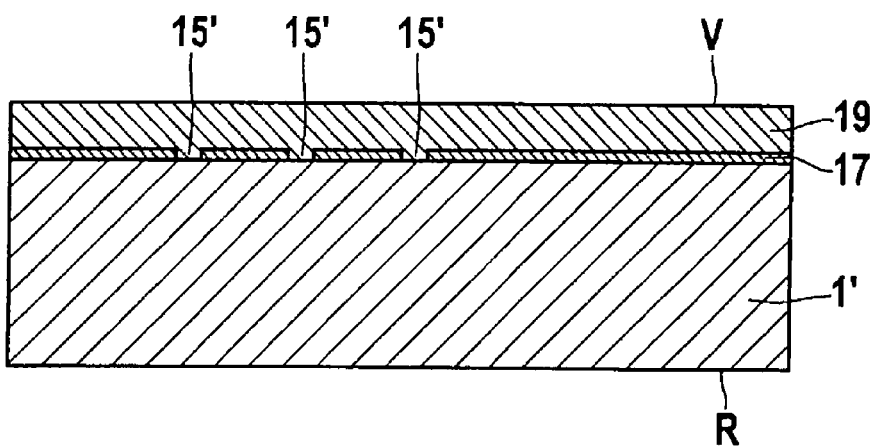
Figure 4C:
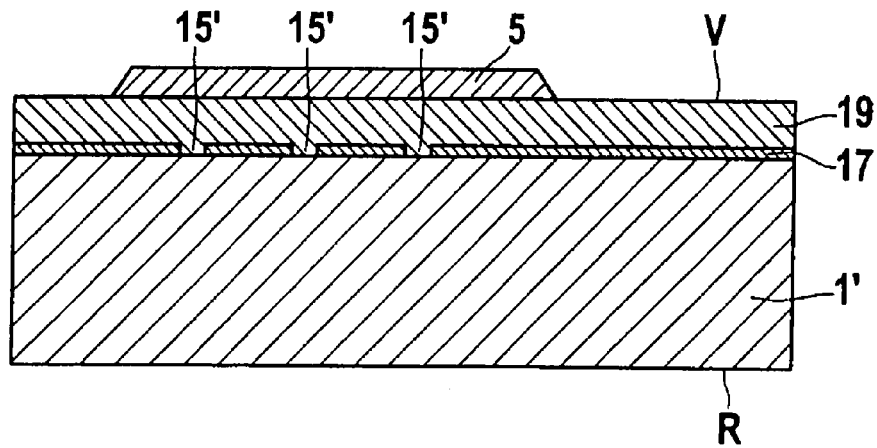

The process steps according to FIGS. 4A-C correspond to the process steps according to FIGS. 2A-C.

Figure 4D:
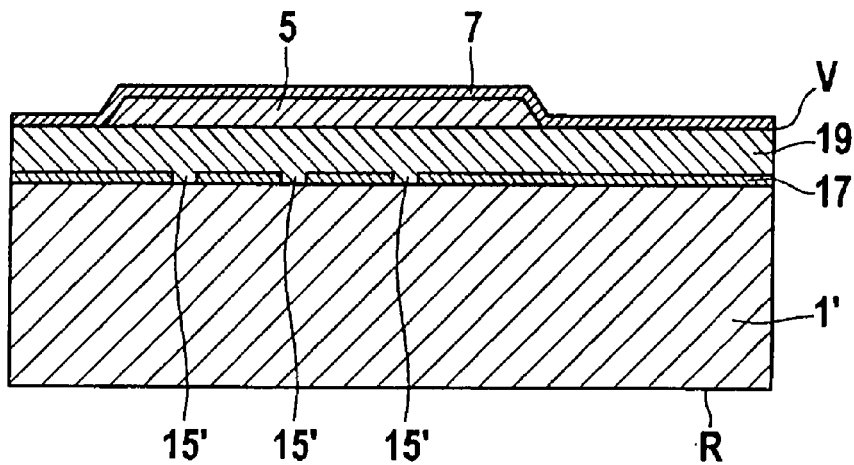
Figure 4E:
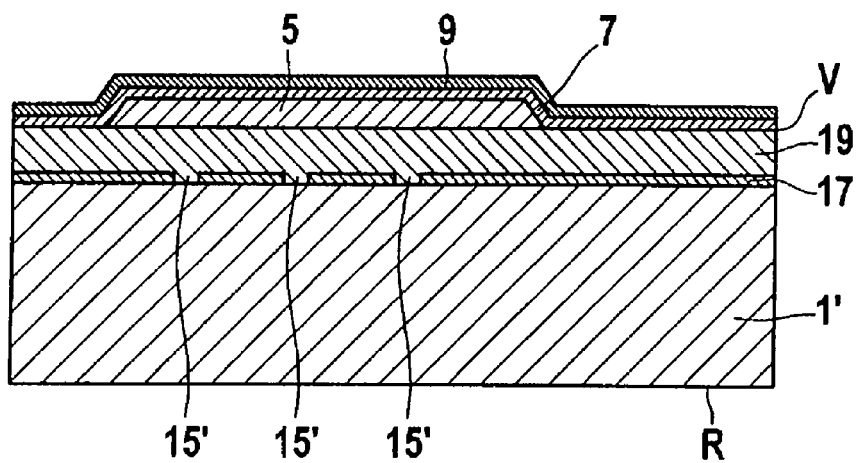

With regard to front side V, the process steps according to FIGS. 4D and 4E correspond to the process steps according to FIGS. 3B and 3C.

Figure 4F:
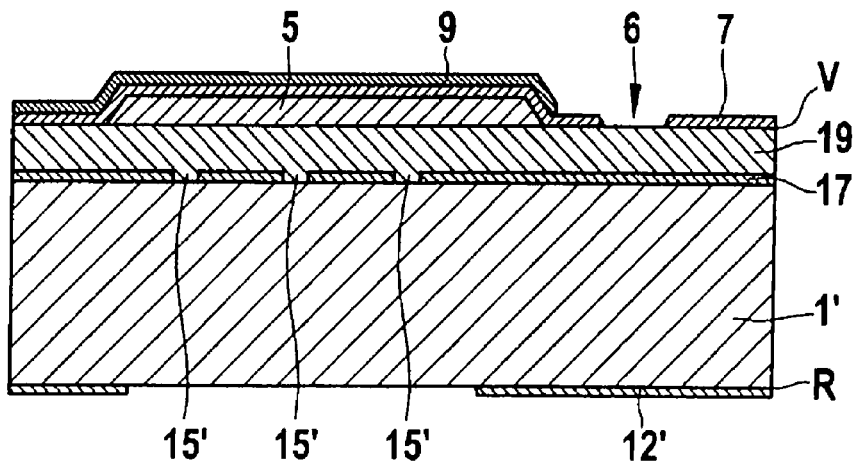
Figure 4G:
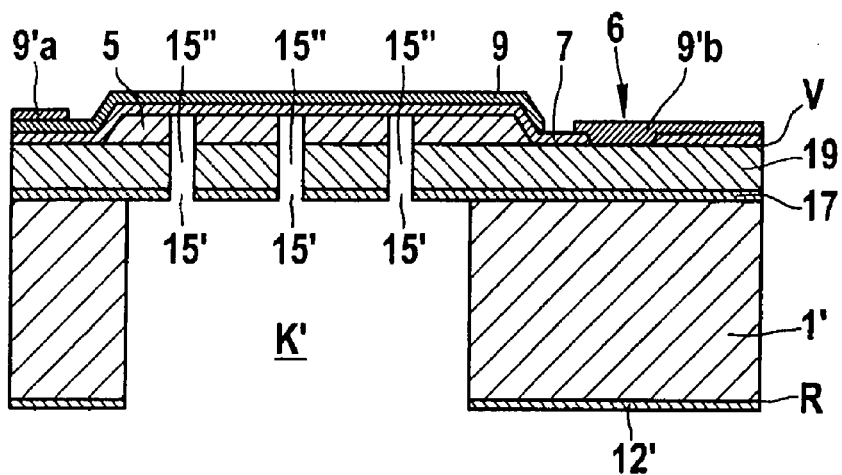
Figure 4H:
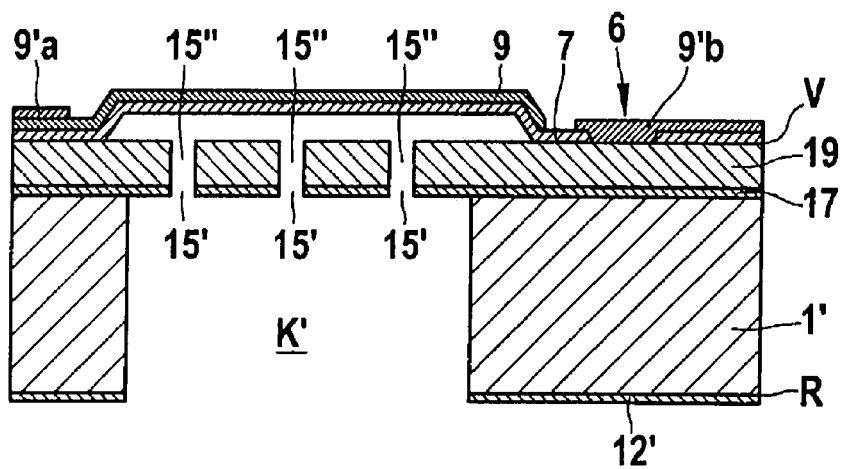

With regard to the back surface of the wafer, the process steps according to FIGS. 4F,G,H correspond to the process steps according to FIGS. 2F,G,H. With regard to front side V of the wafer they correspond to the process steps according to FIGS. 3D,E,F.

Figure 4I:
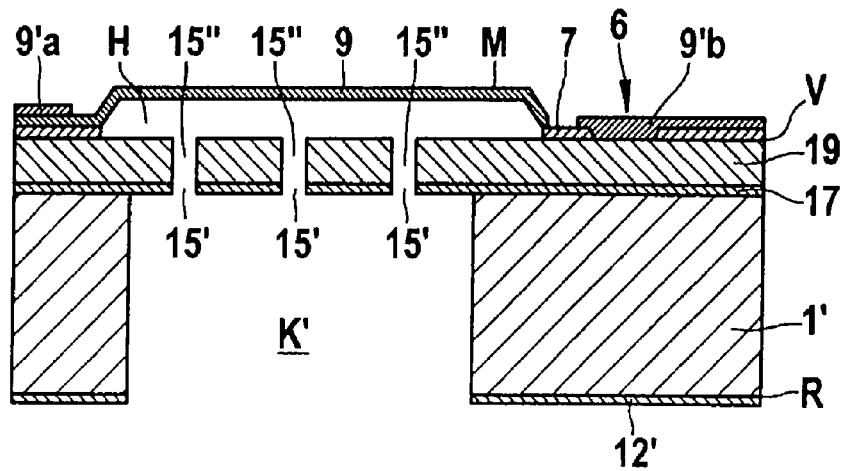

In the process step according to FIG. 4I, dielectric layer 7 is finally removed in the diaphragm region or hollow space H by an HF-vapor etching step, as already explained in connection with FIG. 3H.

FIGS. 5A-H show schematic cross-sectional views of the essential manufacturing steps of a micromechanical component in the form of a microphone or pressure sensor, according to a fifth specific embodiment of the present invention.

The background of the variants of the exemplary embodiments and/or exemplary methods of the present invention in FIG. 5 and FIG. 6 is the necessity of applying diffusion barriers for germanium between the sacrificial SiGe layer and the lower silicon or epitaxial polysilicon layer in the cases, in which high-temperature steps are still provided after the SiGe deposition on the wafer. High-temperature steps may be used, for example, to grow oxide layers on silicon or SiGe. This thermal oxidation takes place at temperatures >900° C., preferably at temperatures >1000° C., e.g. at 1100° C. A further case of a high-temperature treatment occurs when the mechanical properties of the LPCVD polysilicon used as a micromechanical diaphragm material should be changed, in particular improved, i.e., for example, when a specified tensile stress and low voltage gradients should be set, the material should be rendered rigid, or introduced dopants should simply be activated to render the polysilicon electrically very well conductive. For example, annealing at 1100° C. for a time period of 10 minutes to 1 hour in a LPCVD reactor may allow a specified, low tensile stress of, e.g. 50 MPa to be produced in previously deposited polysilicon, and may allow dopants to be simultaneously activated, which are both highly advantageous for the function as a diaphragm material and should therefore be striven for. In the case of such high temperatures, germanium becomes mobile and has a measurable diffusion rate in silicon, i.e. in silicon, Ge atoms can cover distances of a few µm in the specified periods of time. During such a high-temperature treatment, it must always be ensured that Ge does not diffuse into adjacent silicon in too high a concentration (% range), since this interdiffusion would convert silicon into SiGe, and the selectivity during the subsequent sacrificial-layer etching would consequently be lost. The diffusion rate of Ge is particularly high in polycrystalline silicon layers, i.e. when the layer containing germanium borders on polysilicon or epitaxial polysilicon, since the polycrystalline materials have grain boundaries, which allow particularly rapid diffusion of the Ge along the grain boundaries. While the Ge diffusion in adjacent monocrystalline silicon even remains nearly negligible during the specified process times without protective measures, the Ge diffusion along the grain boundaries of polycrystalline silicon would be accelerated by several times and would be no longer negligible. In the cases in which a lower epitaxial polysilicon layer 19 is provided and a high-temperature treatment should take place, a diffusion barrier to the sacrificial SiGe layer deposited over it must therefore be provided under all circumstances, in order to reliably suppress disruptive outdiffusion of Ge and grain-boundary diffusion in the polycrystalline Si material. In the variants of FIGS. 5 and 6, this is provided by additional dielectric layer 1a, which may be implemented as a thin silicon-oxide layer having a thickness of, e.g. <500 nm, preferably <100 nm. Silicon-oxide layers having a thickness of only a few tens of nanometers are already suitable for reliably preventing Ge diffusion, even at high temperatures.

Figure 5A:
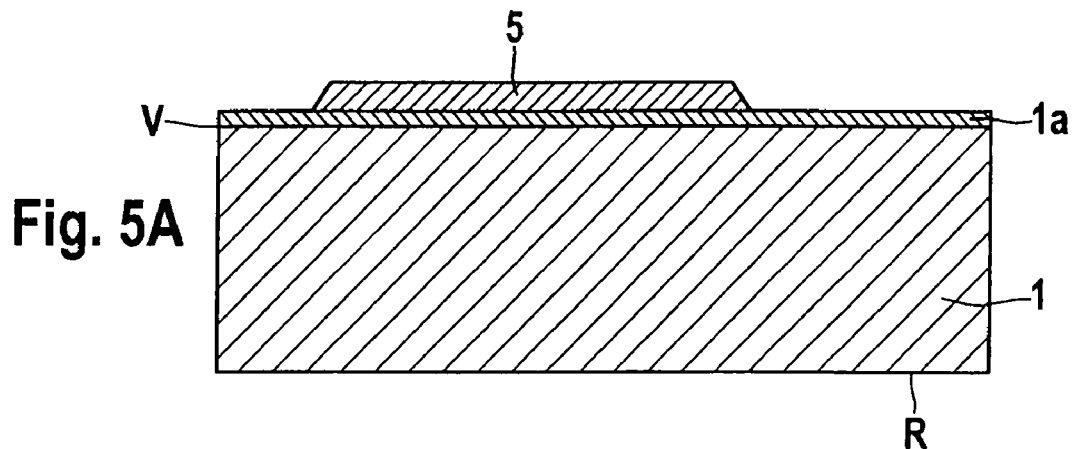
FIGS. 5A-H shows schematic cross-sectional views of the essential manufacturing steps of a micromechanical component in the form of a capacitive microphone or pressure sensor, according to a fifth specific embodiment of the present invention.

According to FIG. 5A, for the above-described purpose, a silicon-oxide layer 1a is initially provided on silicon-wafer substrate 1, and indeed, using either thermal oxidation or an appropriate deposition method. This thin oxide layer is used, inter alia, as a diffusion barrier to the subsequently deposited, sacrificial SiGe layer, namely as a Ge diffusion stop at high temperatures. Subsequent to this, sacrificial layer 5 is deposited and patterned, as already explained in detail in connection with the preceding specific embodiments.

Figure 5B:
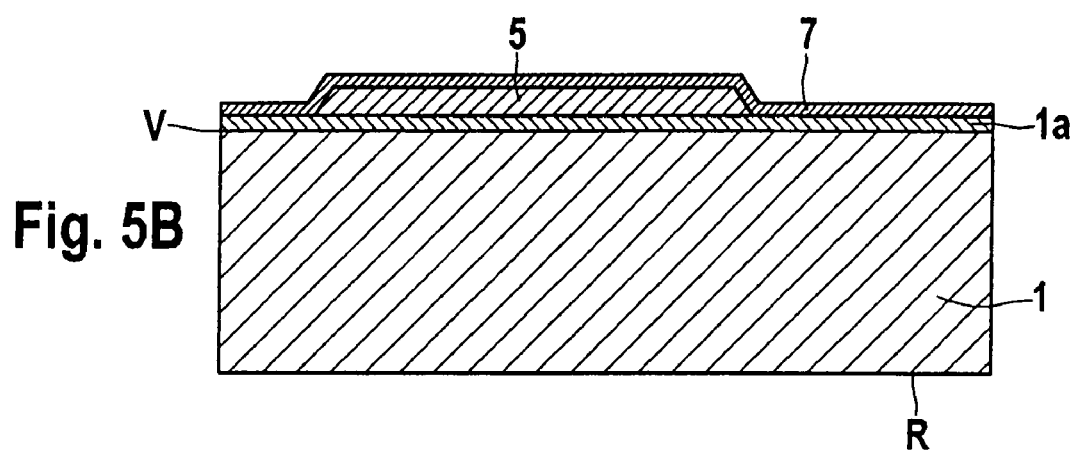
Figure 5C:
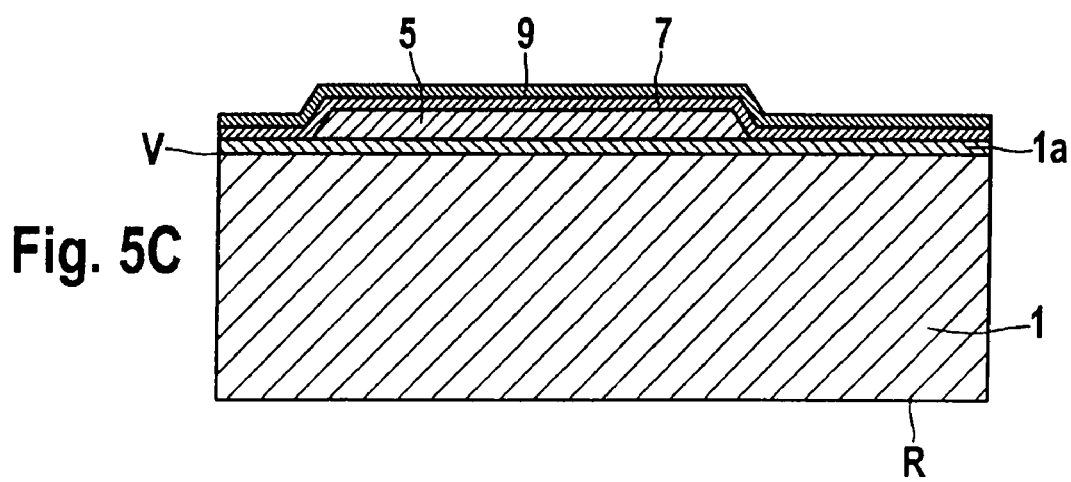
Figure 5D:
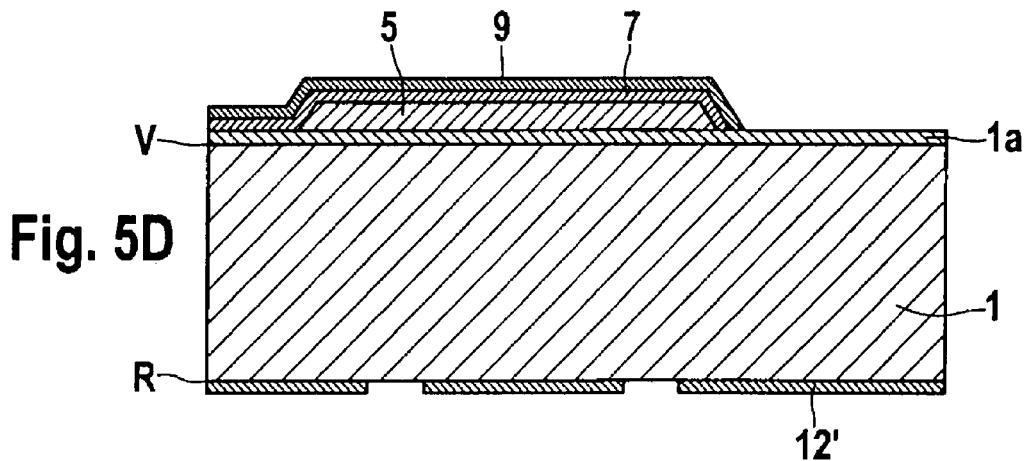

Then, with reference to FIG. 5B, dielectric layer 7 is deposited, in this case especially in the form of $SiO_2$ and/or $Si_3N_4$, by which it is particularly possible to set suitable stress conditions in the layer system. For example, a very thin (100 nm) LPCVD nitride layer ($Si_3N_4$) has an intrinsic tensile stress high enough to place the entire future diaphragm in tension, which is particularly advantageous for the functionality of the diaphragm that is thereby rendered flat. Even a combination of a lower, very thin oxide and a nitride positioned over it satisfies this function of producing a sufficiently high tensile stress, the lower oxide later advantageously protecting the nitride during the sacrificial-layer etching from an etch attack by the reaction products of the $ClF_3$ etching. This lower oxide or the oxide layer alone may also be thermally grown on the sacrificial SiGe layer by oxidation, since during the thermal SiGe oxidation, and therefore high-temperature treatment, the outdiffusion of Ge atoms into the subjacent silicon substrate is effectively prevented by diffusion barrier 1a. With reference to FIG. 5C, electrically conductive polysilicon layer 9 is subsequently deposited over dielectric layer 7, and, as is apparent from FIG. 5D, it is patterned simultaneously to dielectric layer 7 in an etching step, e.g. a plasma etching step. In this case, there is also the advantageous option of using a high-temperature treatment of polysilicon layer 9 after its deposition in the LPCVD reactor at a low temperature (T~600° C.) to subsequently improve its mechanical properties and to simultaneously set the desired electrical conductivity.

Figure 5E:
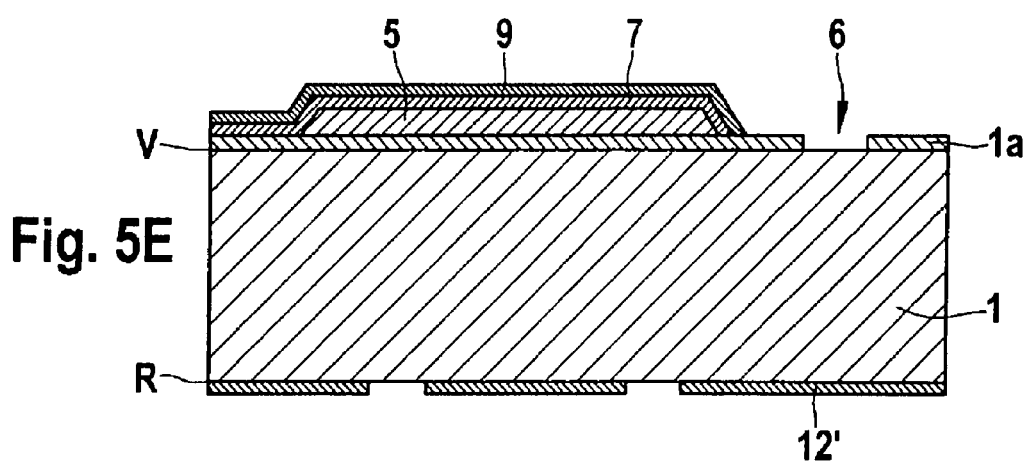

Then, with reference to FIGS. 5E and 5F, a window 6 is initially opened in silicon-oxide layer 1a to expose silicon-wafer substrate 1, and an additional, electrically conductive layer 9'a,b is subsequently deposited and patterned. In this context, the electrically conductive layer is completely removed from the diaphragm region and only left in the periphery of the diaphragm region, to be more precise, on the left side of FIG. 5F in region 9'a for connecting conductive polysilicon layer 9, and on the right side of FIG. 5F in region 9'b for connecting the silicon-wafer substrate.

Figure 5F:
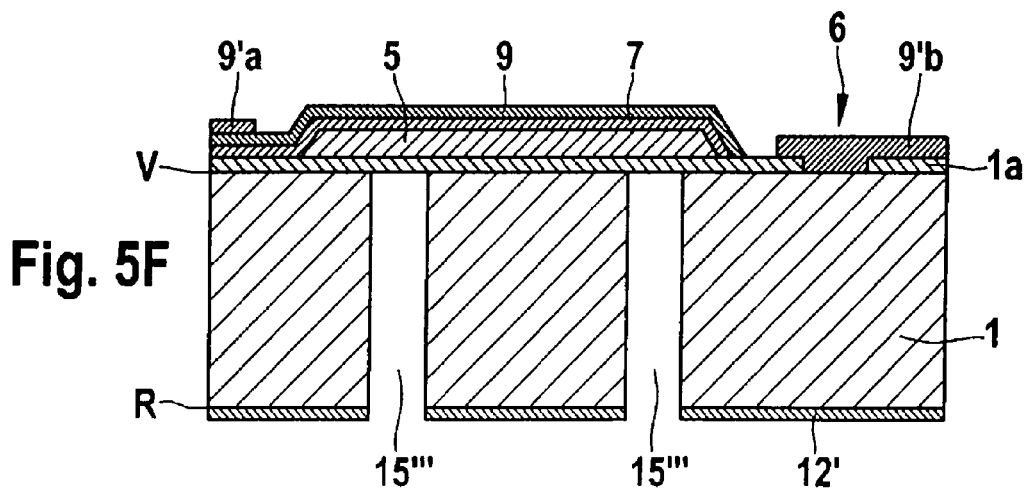

In FIG. 5F, it is also shown that masking layer 12' of thick photoresist is applied on back surface R of the wafer, and with its aid, the trenching process is carried out, using the already mentioned plasma-etching method, in this case, oxide layer 1a acting as an etching stop, which allows a certain process safety with respect to overetching. At this point, one may alternatively proceed in a manner analogous to the process steps of FIGS. 1D-1F, i.e. using a two-stage, deep-etching process and two-step etch masking on the back surface of the wafer, in order to be able to produce a cavity and perforation openings for the function as a microphone.

Figure 5G:
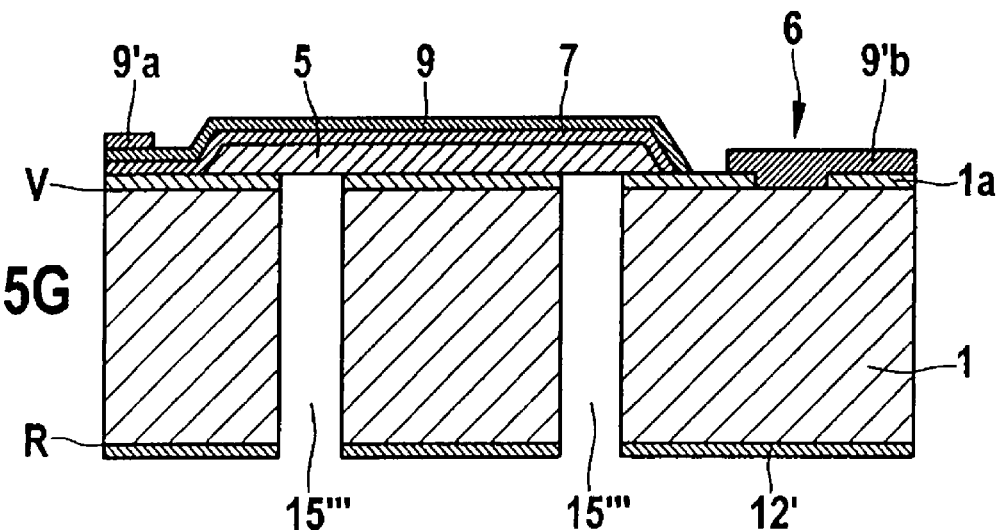
Figure 5H:
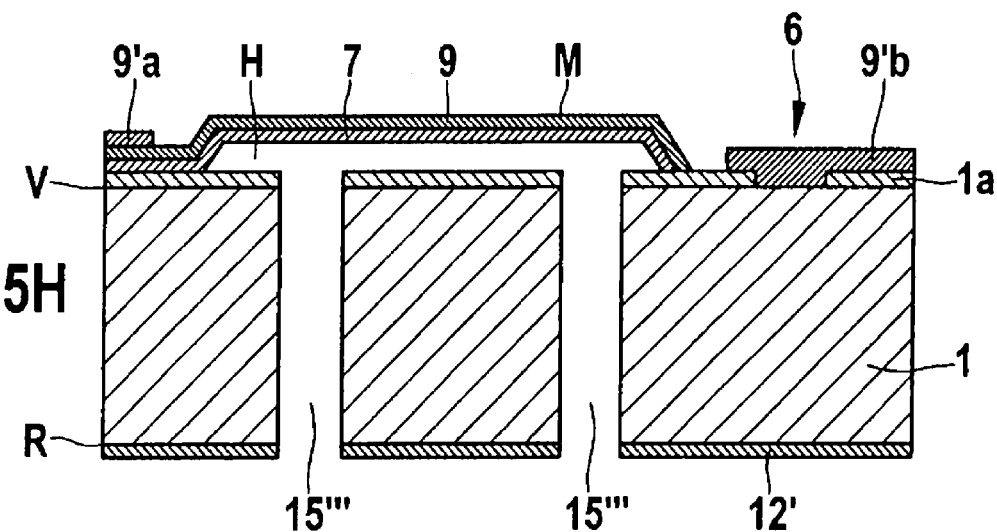

As shown in FIG. 5G, the oxide layer is then opened in the perforation holes 15''' formed by the trench etching, in order to expose sacrificial layer 5. After oxide layer 1a is opened, sacrificial layer 5 is selectively removed by the already-mentioned $ClF_3$ sacrificial-layer etching. In this context, front side V of the wafer is preferably protected by a previously applied resist, e.g. photoresist or polyimide or laminated foil, from damage during the phase-down processing and possibly during future saw-processing steps and cleaning, as well. In this specific embodiment, dielectric layer 7 remains in the diaphragm region and forms a part of two-layer diaphragm M above hollow space H, although it could also be removed, as in the above-mentioned specific embodiment.

As a further variant of this specific embodiment and other specific embodiments, it should be mentioned that in contrast to depositing dielectric layer 7 on sacrificial layer 5, the silicon-germanium of sacrificial layer 5 may also be thermally oxidized. The oxide formed in the process is then used as a dielectric. An advantage of this variant is that the deposition and patterning of dielectric layer 7 may then be omitted. The thermal oxide formed in this manner advantageously grows almost only on the specific, patterned SiGe regions, which represents a self-adjusting process since SiGe thermally oxidizes markedly more rapidly than Si. The deposition of polysilicon layer 9 on the entire surface would then take place subsequently to this thermal oxidation, the thermally grown oxide layer being used, in turn, as a diffusion barrier between the polysilicon-germanium and the polysilicon during a subsequent high-temperature treatment occurring later. In this context, it is particularly advantageous that, as long as the germanium proportion in the silicon-germanium layer is less than 50%, the oxide thermally grown on it contains no germanium, because the excess of silicon in the $SiGe/SiO_2$ boundary layer causes germanium oxide to be constantly reduced, pure $SiO_2$ being formed. Under these conditions, one therefore obtains a silicon oxide that remains free of germanium oxides to the greatest possible extent, which has advantages regarding the suppression of germanium diffusion.

FIGS. 6A-J show schematic cross-sectional views of the essential manufacturing steps of a micromechanical component in the form of a microphone or pressure sensor, according to a sixth specific embodiment of the present invention. Against the background of a high-temperature treatment, a diffusion barrier 1'a is also provided between sacrificial SiGe layer 5 and lower epitaxial polysilicon layer 19.

The modification of the second specific embodiment to form the specific embodiment shown in FIGS. 6A through 6J is analogous to the preceding modification of the first specific embodiment to form the fifth specific embodiment. The process steps according to FIGS. 6A and 6B correspond to the process steps according to FIGS. 2A and 2B. In the process step according to FIG. 6C, oxide layer 1'a is deposited or oxidized onto epitaxial polysilicon layer 19. This oxide layer is used predominantly as a diffusion barrier, in order to prevent the inward diffusion and the rapid diffusion of Ge from the sacrificial SiGe layer into and in epitaxial polysilicon 19 during subsequent high-temperature processing steps. Since Ge displays rapid grain-boundary diffusion in polysilicon at high temperatures, this measure is necessary, as described above. Sacrificial layer 5 is then deposited and patterned, and dielectric layer 7 is subsequently deposited in accordance with FIG. 6D, and electrically conductive polysilicon layer 9 situated above it is deposited according to FIG. 6E.

Figure 6A:
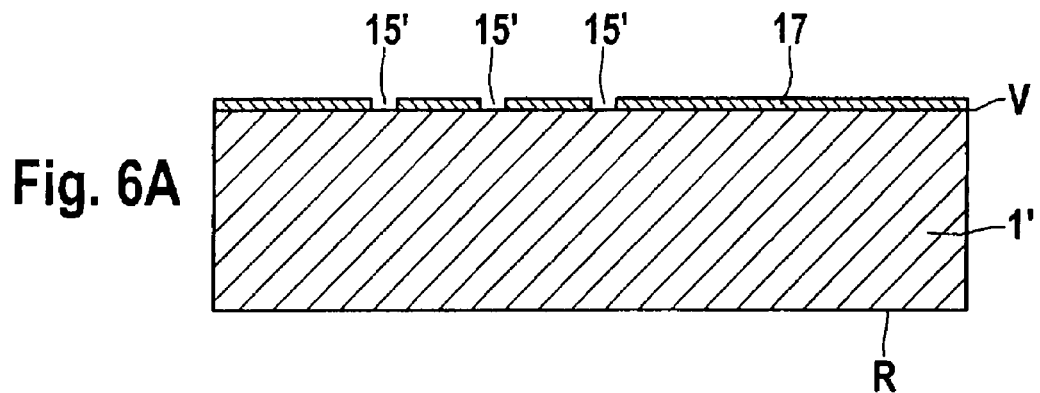
FIGS. 6A-J shows schematic cross-sectional views of the essential manufacturing steps of a micromechanical component in the form of a capacitive microphone or pressure sensor, according to a sixth specific embodiment of the present invention.
Figure 6B:
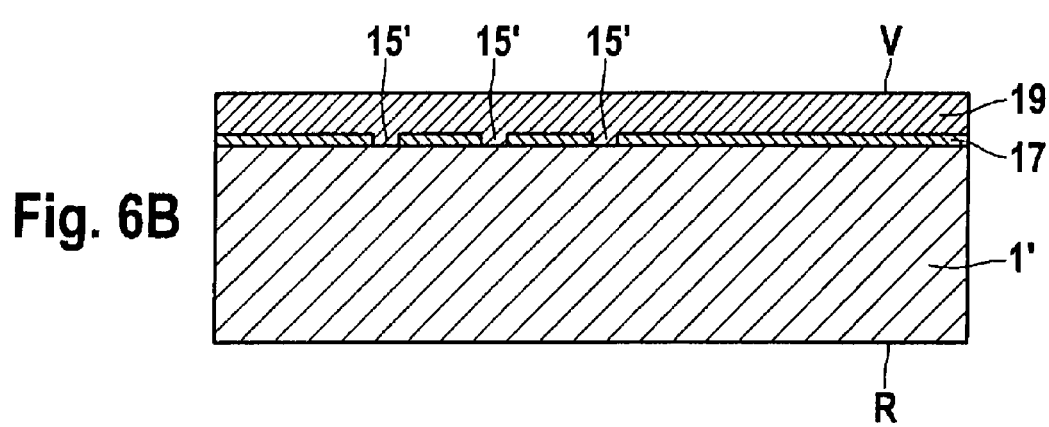
Figure 6C:
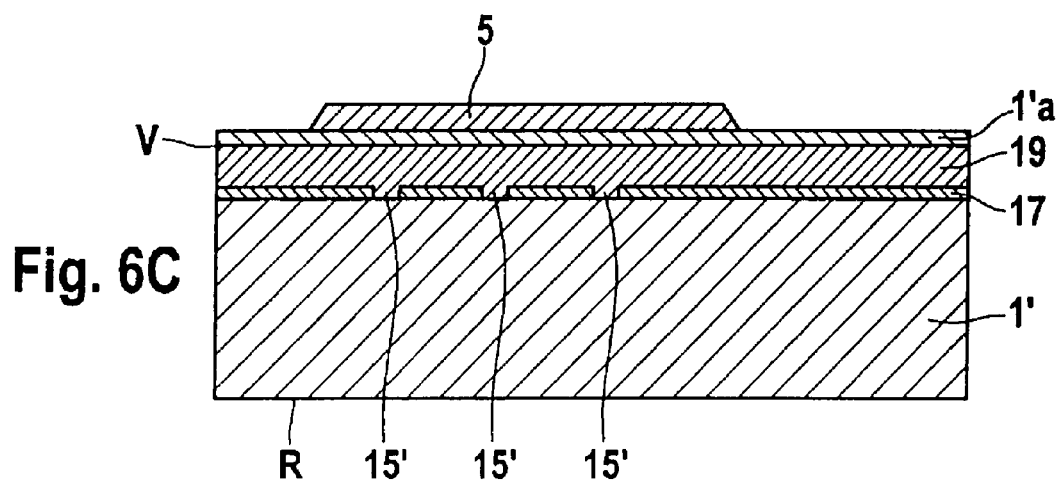
Figure 6D:
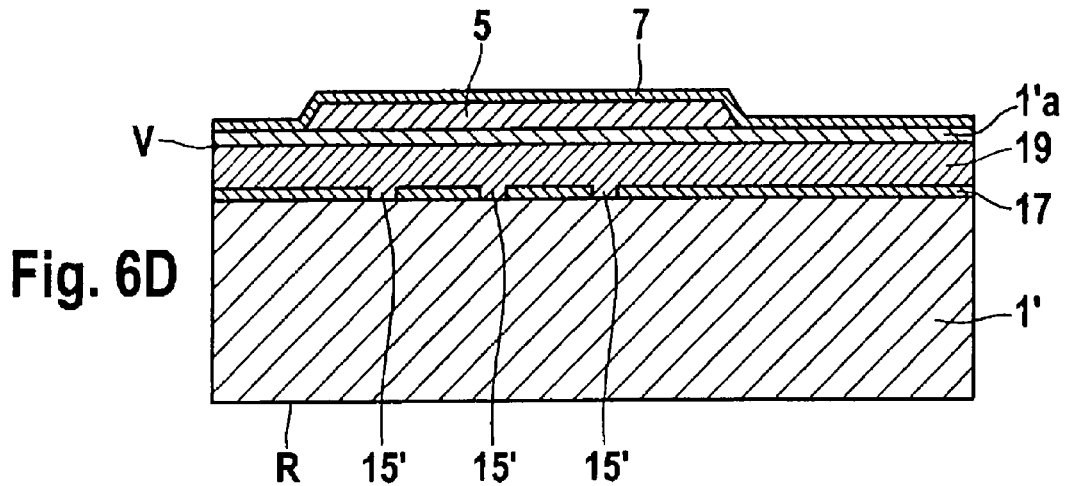
Figure 6E:
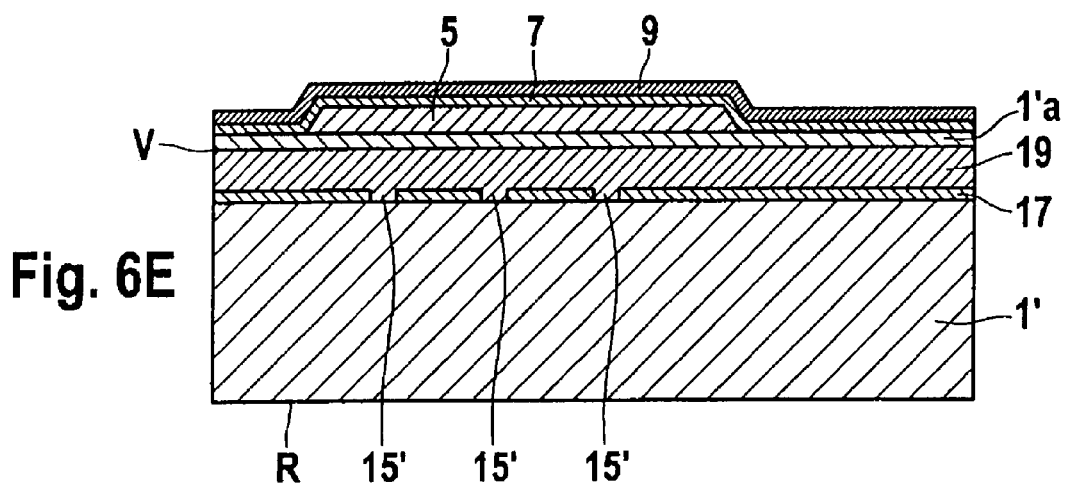
Figure 6F:
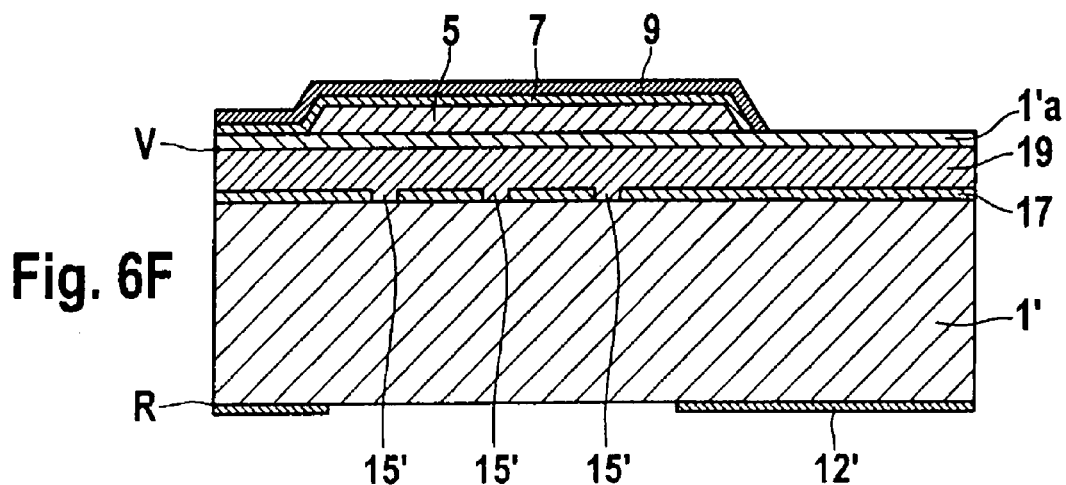

The simultaneous patterning of dielectric layer 7 and conductive layer 9 is shown in FIG. 6F. In addition, masking layer 12' on back surface R of the wafer is formed from photoresist.

Figure 6G:
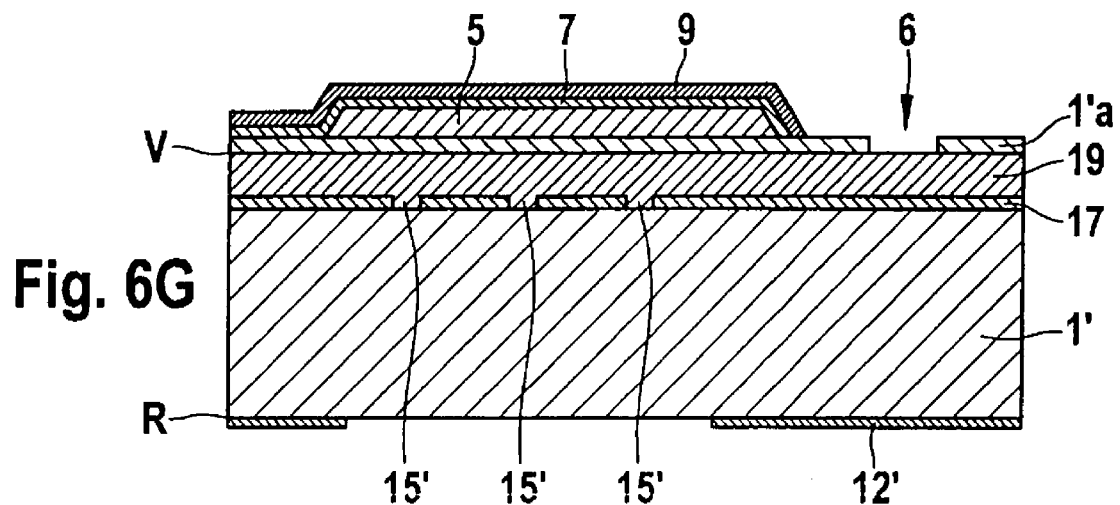

According to FIG. 6G, window 6 is formed in silicon-oxide layer 1a to expose and subsequently contact epitaxial polysilicon layer 19 electrically.

Figure 6H:
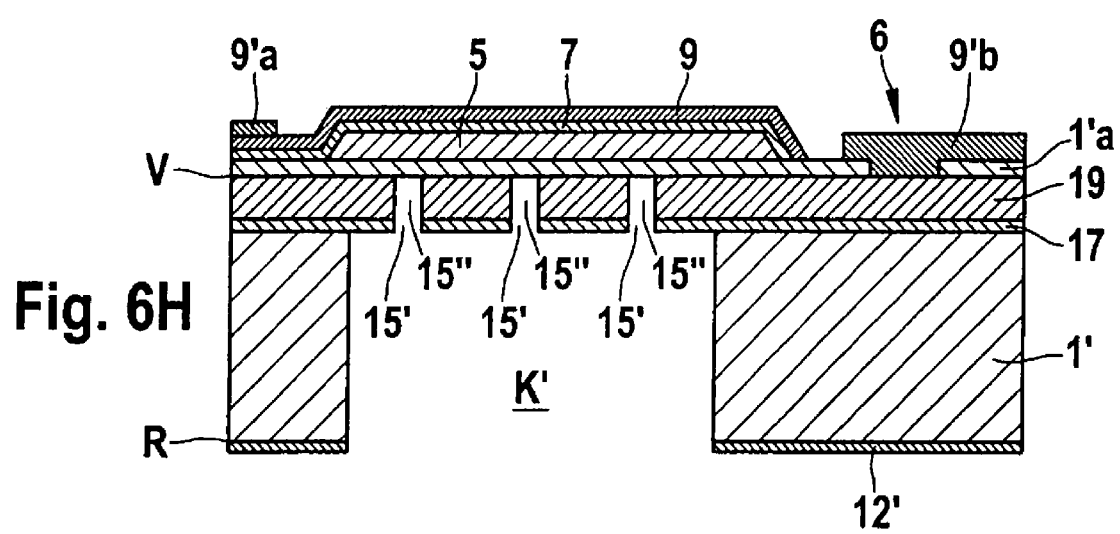
Figure 6I:
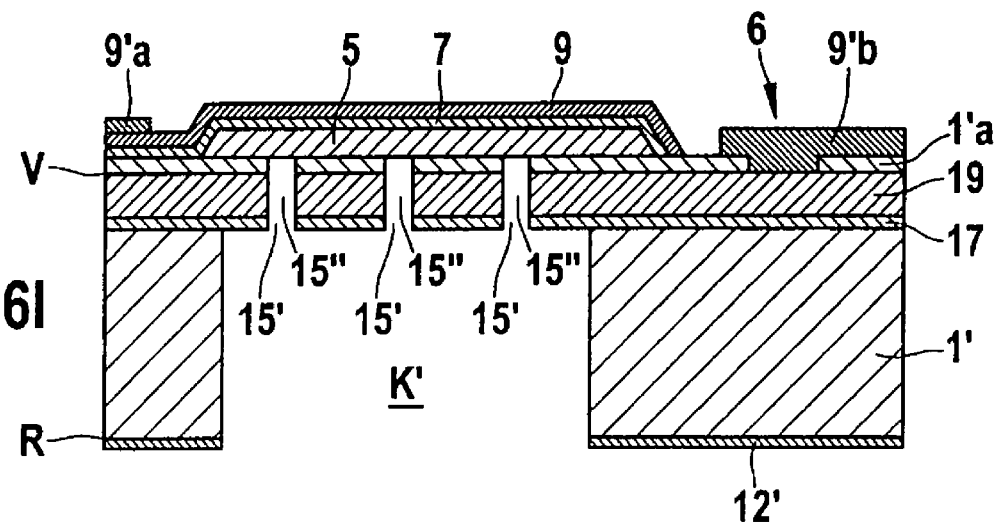
Figure 6J:
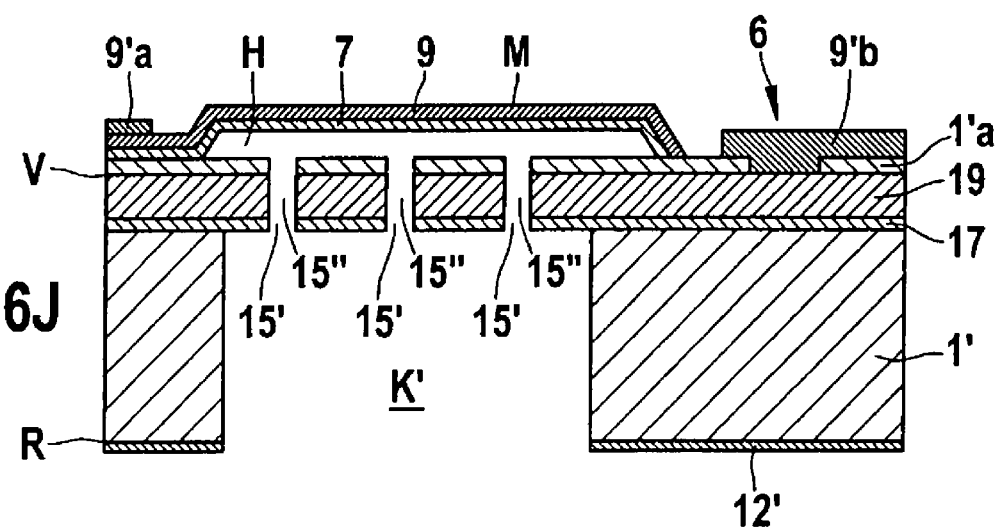

Then, in reference to FIG. 6H, the trench etching process is carried out, which forms cavity K' below the diaphragm region and then continues to run through holes 15' of dielectric layer 17 into perforation openings 15" of epitaxial polysilicon layer 19, and finally stops at silicon-oxide layer 1'a. According to FIG. 6I, as in the case of the above-mentioned specific embodiment, exposed silicon-oxide layer 1'a is then opened from back surface R of the wafer, and sacrificial layer 5 is subsequently removed by the previously mentioned ClF$_3$ sacrificial-layer etching process to expose the diaphragm and hollow space H.

In this specific embodiment, dielectric layer 7 is also retained in the diaphragm region.

FIGS. 7A-H show schematic cross-sectional views of the essential manufacturing steps of a micromechanical component in the form of a capacitive microphone or pressure sensor, according to a seventh specific embodiment of the present invention.

With reference to FIG. 7A, on a silicon-wafer substrate 1', a dielectric layer 17 of, for example, silicon oxide is deposited or thermally oxidized onto front side V of the wafer. Mask openings 15' corresponding to future perforation holes in the future counterplate are lithographically defined and opened in dielectric layer 17 as windows.

Furthermore, with reference to FIG. 7B, a polysilicon layer 19 is deposited over the whole surface of front side V of the wafer. Up to this method stage, then, the seventh specific embodiment corresponds to the above-explained second specific embodiment. After the depositing of polysilicon layer 19, a masking layer 17', for instance, also made of silicon oxide, is then deposited on the front side V and patterned in such a way that it has a window MF in the region of the future diaphragm. Incidentally, this masking layer 17' of silicon oxide is later also used as insulation layer for the final component.

Figure 7C:
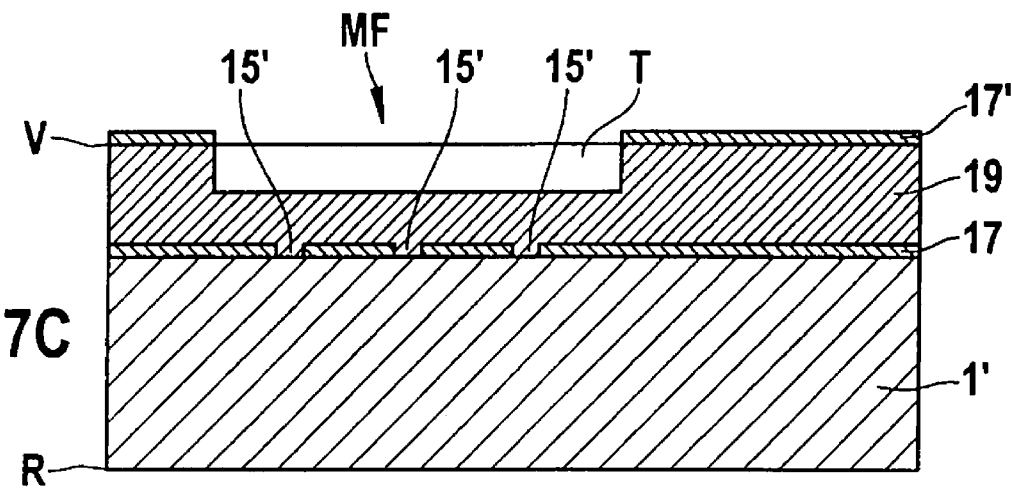

With regard to FIG. 7C, a trench etching process takes place to form a trench-like depression T in polysilicon layer 19.

Figure 7D:
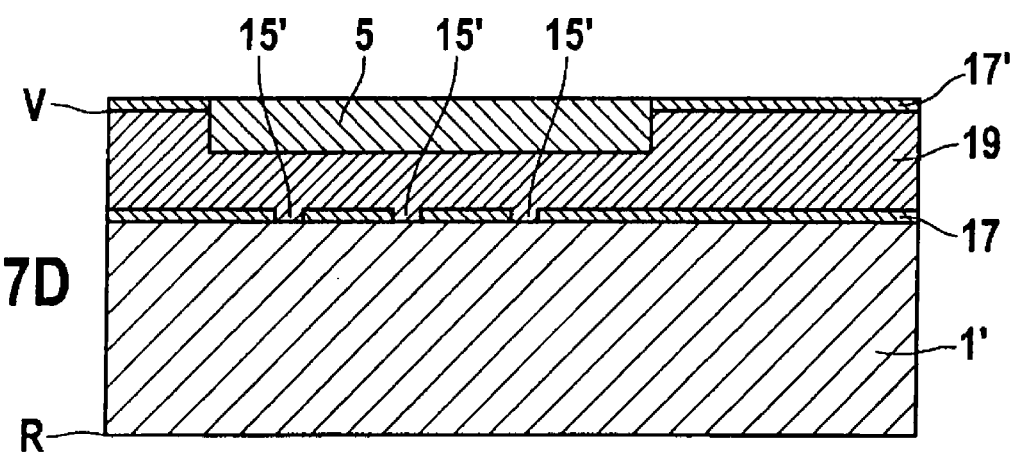
Figure 7E:
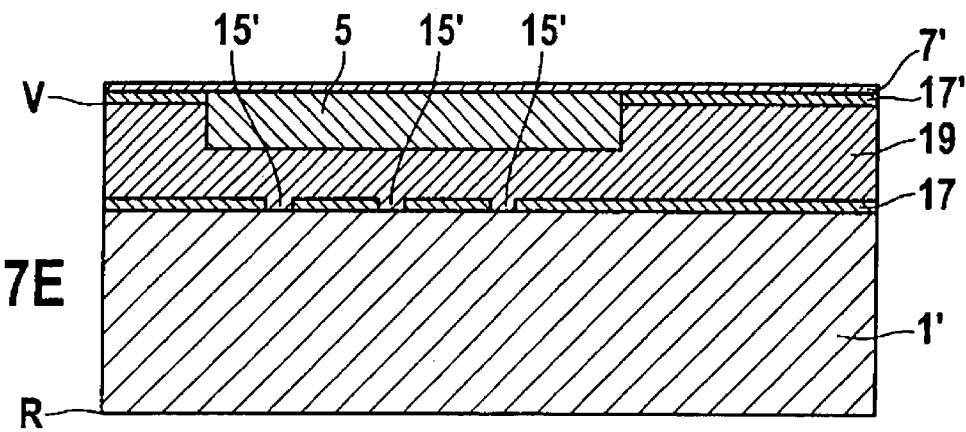

After the trench etching process, in depression T, sacrificial layer 5 of silicon-germanium or germanium is selectively deposited with respect to surrounding masking layer 17', which leads to the process condition according to FIG. 7D, in which trench-like depression T in polysilicon layer 19 was filled up again by SiGe or Ge.

Alternatively, island-type Ge-doped regions can be produced after the opening of window MF in the region of the future diaphragm, with the aid of masking layer 17' made of silicon oxide as implantation mask in windows MF, by ion implantation using germanium.

Furthermore, with reference to 7E, an additional thin oxide layer 7' is applied on the front side (PECVD or LPCVD) or is grown on thermally.

Figure 7F:
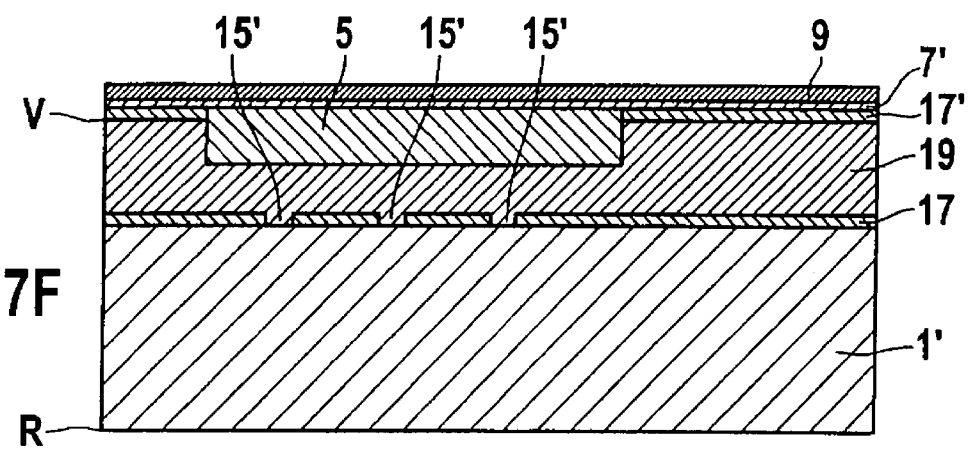

According to FIG. 7F, by analogy to FIG. 2E or 1C, electrically conductive layer 9 of polysilicon is deposited over the entire surface of the entire structure. This can be tempered subsequently, to adjust the mechanical properties of polysilicon layer 9.

The possible materials and variants for layers 7' and 9 are exactly the same as in the above first and second specific embodiments. Layer 7' here corresponds functionally to layer 7 in the first and second specific embodiments.

Figure 7G:
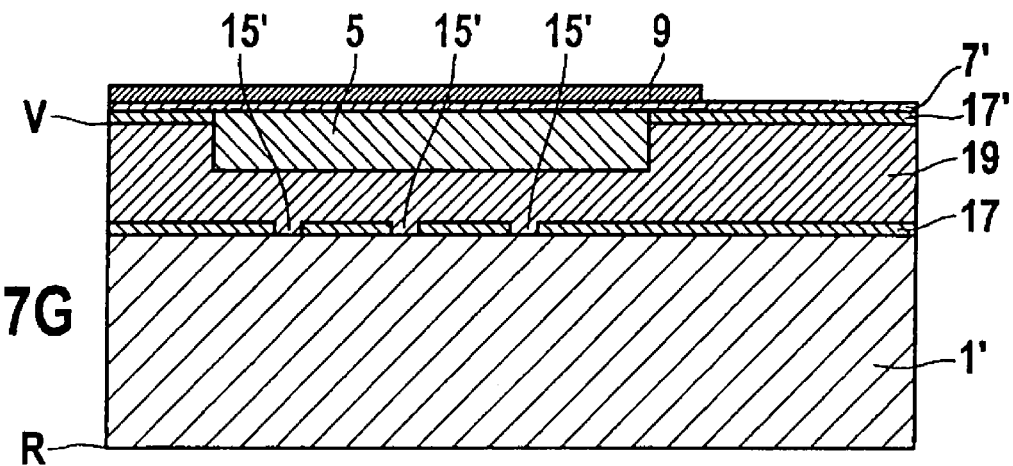
Figure 7H:
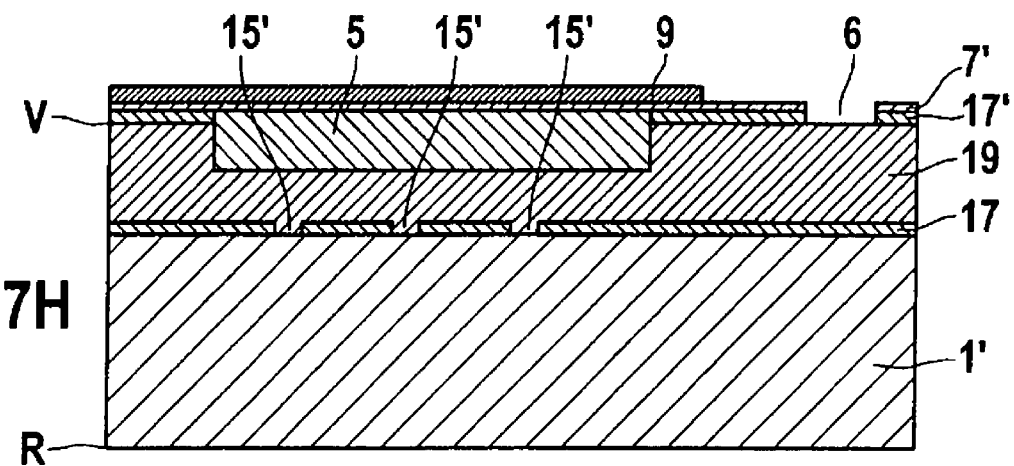

In the following process step, which is illustrated in FIG. 7G, initially conductive layer 9 of polysilicon, and thereafter exposed oxide layers 7', 17' are patterned so as to form window 6, which provides the access to the counterelectrode in the form of polysilicon layer 19, which finally leads to the process condition according to FIG. 7H.

Furthermore, with regard to FIG. 7I, a conductive layer is deposited which, in region 9'a, contacts conductive layer 9 outside the diaphragm region and in region 9'b contacts silicon wafer substrate 1 through window 6. In the process step in reference to FIG. 7I, a masking layer 12', which is preferably a thick resist mask, is then deposited on back surface R of the wafer, which is patterned in such a way that cavity K is located under the future diaphragm. Alternatives with respect to masking layer 12' have already been explained above, in connection with the second specific embodiment.

Figure 7K:
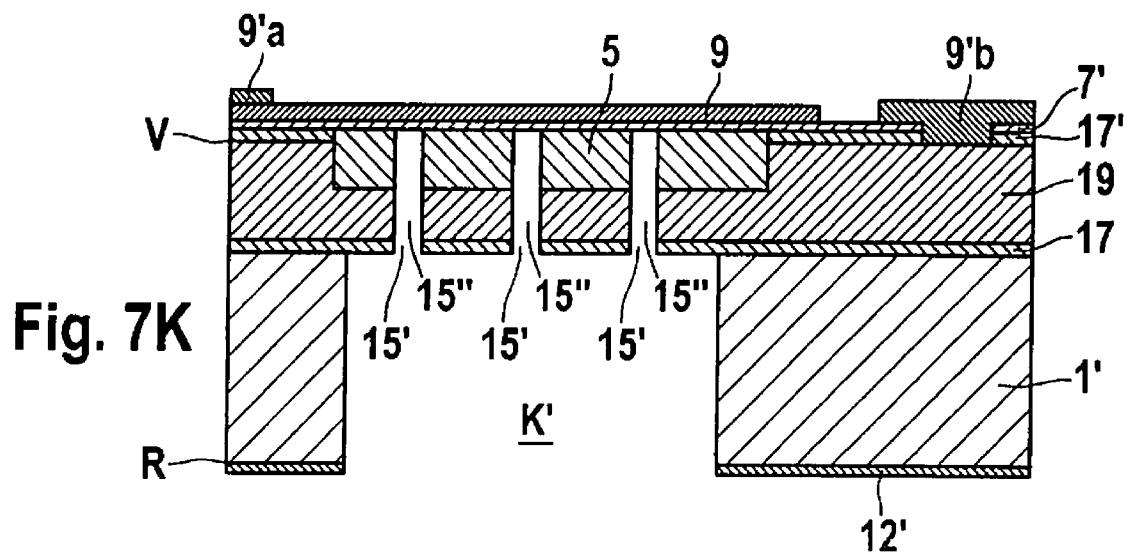

As shown in FIG. 7J, the single step deep etching process for trenching takes place, cavern K' being driven in a planar manner from back surface R of the wafer to front side V of the wafer. The deep-etching process stops two-dimensionally on patterned dielectric layer 17 between silicon-wafer substrate 1' and epitaxial polysilicon layer 19, except for in mask openings 15', where the deep-etching process subsequently continues to progress in epitaxial polysilicon layer 19 up to front side V of the wafer and, if desired, still also through sacrificial layer 5 for the formation of perforation openings 15" adjacent to mask openings 15'. The etching process stops after etching through sacrificial layer 5 on dielectric layer 7', which forms a part of the future diaphragm. The process condition shown in FIG. 7K is thus reached.

Figure 7L:
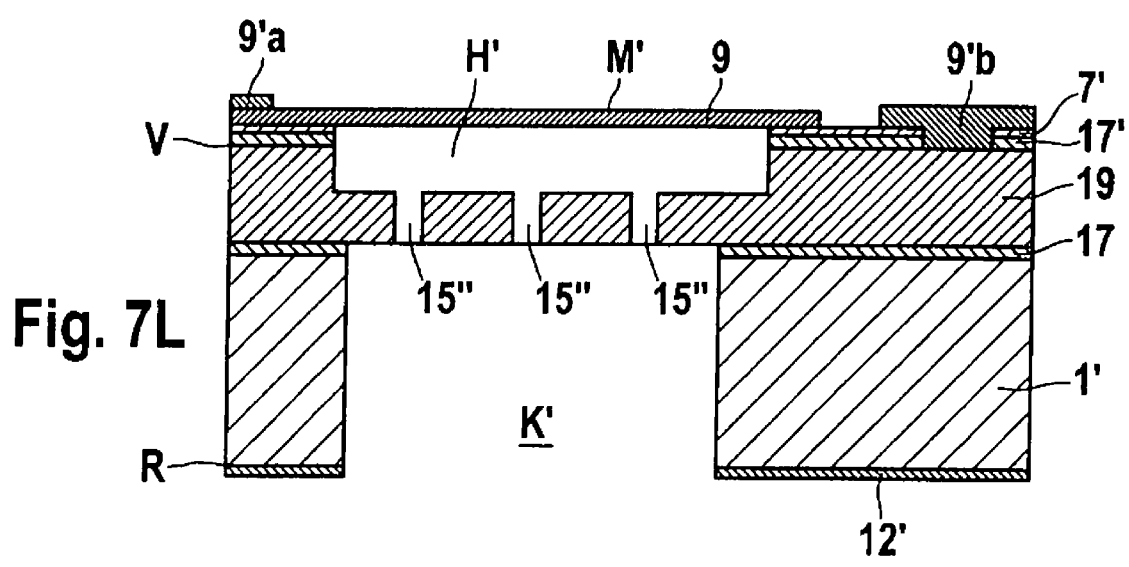

In a final process step shown in FIG. 7L, sacrificial layer 5 is then removed, in a highly selective manner, using, once again, the above-described, isotropic etching using ClF$_3$, from back surface R of the wafer, in order to expose diaphragm M' and hollow space H'. Diaphragm M', thus produced, no longer has a corresponding angle, which has a positive effect on the stress condition of the diaphragm.

By contrast to the above-explained second specific embodiment, in the present specific embodiment, the oxide of oxide layers 17 or 7', 17', remaining in hollow space H', are removed using an additional oxide etching step, for instance, using HF vapor. The mechanical stress condition of both electrodes can also be advantageously influenced thereby.

Although the exemplary embodiments and/or exemplary methods of the present invention has been described above with reference to exemplary embodiments, it is not limited thereto but rather is modifiable in many ways.

In particular, individual process steps may be interchanged with one another in their order without deviating from the subject matter of the exemplary embodiments and/or exemplary methods of the present invention. Thus, e.g. the processing of the back surface of the wafer may take place before the processing of the front side of the wafer or may be completed in itself, or the processing of the front side of the wafer may take place first or be completed in itself, and the processing of the back surface of the wafer may subsequently take place. However, individual process steps may successively alternate with each other on the front side of the wafer and on the back surface of the wafer in the course of the entire process, as well, i.e. the front side of the wafer is processed one time and then the back surface of the wafer again, etc., and indeed, each over one or more steps. The above-mentioned process flows are to be regarded as advantageous in many respects, but this is not the only possible process sequence in the sense of the exemplary embodiments and/or exemplary methods of the present invention. In particular, process parts or process structural parts of the various specific embodiments may be exchanged with one another.

| A List of the Reference Numerals is as follows: | |
|---|---|
| 1, 1' | silicon-wafer substrate |
| 5, 40 | sacrificial layer |
| V | front side of the wafer |
| R | back surface of the wafer |
| 7, 7' | dielectric layer |
| 6 | window |
| 9, 9a, 9b | conductive layer |
| 9', 9'a, 9'b | conductive layer |
| 11 | masking layer |
| 12, 12' | masking layer |
| 15' | mask opening of dielectric layer |
| 15, 15'', 15''' | perforation holes |
| M, M' | diaphragm |
| 17 | dielectric layer |
| 17' | dielectric masking layer |
| MF | window |
| 19, 20, 30 | polysilicon layer |
| 1a, 1'a | oxide layer, (diffusion barrier for Ge) |
| 5 | sacrificial SiGe layer |
| K, K' | cavity |
| 25, 25', 45 | oxide layer |
| H, H' | hollow space |

What is claimed is:

1. A micromechanical component comprising:
    a conductive substrate;
    an elastically deflectable diaphragm having at least one conductive layer, which is provided over a front side of the substrate, the conductive layer being electrically insulated from the substrate;
    a hollow space filled with a medium, which is provided between the substrate and the diaphragm; and
    a plurality of perforation openings running under the diaphragm through the substrate;
    wherein the perforation openings provide access to the hollow space from a back surface of the substrate, so that a volume of the medium located in the hollow space may change when the diaphragm is deflected.

2. The micromechanical component of claim 1, wherein the diaphragm is arched over the front side of the substrate.

3. The micromechanical component of claim 1, wherein the diaphragm is planarly over the front side of the substrate.

4. The micromechanical component of claim 1, wherein the perforation openings lead into a cavity, which is in the back surface of the substrate under the diaphragm.

5. The micromechanical component of claim 1, wherein the diaphragm includes a single conductive layer.

6. The micromechanical component of claim 1, wherein the diaphragm includes an upper conductive layer and a lower, first dielectric layer.

7. The micromechanical component of claim 1, wherein the substrate has a wafer substrate, a second dielectric layer situated on it, and a layer of silicon material situated on the second dielectric layer, and wherein the perforation openings run through the second dielectric layer, the second dielectric layer electrically insulating the wafer substrate and the silicon-material layer on it from each other.

8. The micromechanical component of claim 1, wherein a third dielectric layer is on the front side of the substrate between the substrate and the diaphragm.

9. The micromechanical component of claim 8, wherein the third dielectric layer constitutes a diffusion barrier for Ge and is made of silicon oxide, for example.

10. The micromechanical component of claim 1, wherein the medium is a gas.

* * * * *